United States Patent
Park et al.

(10) Patent No.: US 12,342,701 B2
(45) Date of Patent: Jun. 24, 2025

(54) DISPLAY PANEL

(71) Applicant: Samsung Display Co., Ltd., Yongin-Si (KR)

(72) Inventors: Kwangwoo Park, Hwaseong-si (KR); Minjung Ann, Asan-si (KR); Yechan Choi, Anyang-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 372 days.

(21) Appl. No.: 17/745,827

(22) Filed: May 16, 2022

(65) Prior Publication Data

US 2023/0049290 A1 Feb. 16, 2023

(30) Foreign Application Priority Data

Aug. 11, 2021 (KR) .................. 10-2021-0106055

(51) Int. Cl.
| | |
|---|---|
| *H10K 59/131* | (2023.01) |
| *H10K 50/80* | (2023.01) |
| *G09G 3/3225* | (2016.01) |
| *H10K 59/126* | (2023.01) |

(52) U.S. Cl.
CPC ......... *H10K 59/1315* (2023.02); *H10K 50/80* (2023.02); *G09G 3/3225* (2013.01); *G09G 2300/0452* (2013.01); *G09G 2300/0819* (2013.01); *H10K 59/126* (2023.02)

(58) Field of Classification Search
CPC .. H10K 59/1315; H10K 50/80; H10K 59/126; H10K 59/131; H10K 59/1213; H10K 59/1216; H10K 59/124; H10K 59/35; G09G 3/3225; G09G 2300/0452; G09G 2300/0819; G09G 3/3208; G09G 2300/0426; H10D 10/821; H10D 64/511; H10D 84/953; H10D 88/101
See application file for complete search history.

(56) References Cited

U.S. PATENT DOCUMENTS

| | | | |
|---|---|---|---|
| 10,978,537 B2 * | 4/2021 | Ebisuno | H10K 59/8791 |
| 11,177,335 B2 * | 11/2021 | Park | H10D 10/821 |
| 12,075,671 B2 * | 8/2024 | Jo | H01L 27/1255 |
| 2014/0217397 A1 * | 8/2014 | Kwak | H10K 59/131 |
| | | | 257/43 |

(Continued)

FOREIGN PATENT DOCUMENTS

| | | | | |
|---|---|---|---|---|
| CN | 103872080 A | * | 6/2014 | ......... H01L 23/5225 |
| CN | 109671761 A | | 4/2019 | |

(Continued)

*Primary Examiner* — Mohammed Shamsuzzaman
(74) *Attorney, Agent, or Firm* — Innovation Counsel LLP

(57) ABSTRACT

Provided is a display device having defined therein an opening corresponding to a boundary region, and including a plurality of insulating layers disposed on a base layer, an organic layer disposed in the opening, a first connection electrode disposed on the uppermost insulating layer among the plurality of insulating layers, connected to a first signal line through a first contact hole passing through the organic layer, and connected to a transistor through a second contact hole passing through corresponding insulating layers among the plurality of insulating layers, and a second signal line disposed on a layer different from a layer on which the first line is disposed.

18 Claims, 21 Drawing Sheets

(56) References Cited

U.S. PATENT DOCUMENTS

| | | | | |
|---|---|---|---|---|
| 2015/0009465 A1* | 1/2015 | Park | ................. | G02F 1/1393 |
| | | | | 349/139 |
| 2016/0118451 A1* | 4/2016 | Youn | ................. | H01L 27/1248 |
| | | | | 257/66 |
| 2016/0204177 A1* | 7/2016 | Kim | ................. | H10K 59/131 |
| | | | | 257/40 |
| 2017/0317155 A1* | 11/2017 | Oh | ................. | H01L 28/60 |
| 2018/0261797 A1* | 9/2018 | Lee | ................. | H10K 59/352 |
| 2019/0148476 A1* | 5/2019 | Park | ................. | H10K 59/8731 |
| | | | | 257/40 |
| 2021/0336164 A1 | 10/2021 | Bu | | |
| 2024/0381692 A1* | 11/2024 | Lim | ................. | H10K 59/126 |

FOREIGN PATENT DOCUMENTS

| | | | | |
|---|---|---|---|---|
| CN | 110034126 A * | 7/2019 | ......... | H01L 27/1214 |
| KR | 10-2018-0017280 A | 2/2018 | | |
| KR | 10-2019-0055868 A | 5/2019 | | |
| WO | WO-2010052962 A1 * | 5/2010 | ....... | G02F 1/136286 |
| WO | WO-2010100790 A1 * | 9/2010 | ....... | G02F 1/136213 |

* cited by examiner

DISPLAY PANEL

CROSS-REFERENCE TO RELATED APPLICATIONS

This U.S. non-provisional patent application claims priority under 35 U.S.C. § 119 to Korean Patent Application No. 10-2021-0106055, filed on Aug. 11, 2021, the entire contents of which are hereby incorporated by reference.

BACKGROUND

The present disclosure herein relates to a display panel, and more specifically, to a flexible display panel.

Electronic devices such as smart phones, tablet PCs, laptop computers, vehicle navigation units, and smart televisions have been developed. Such electronic devices are equipped with display devices in order to provide information.

Various types of display devices have been developed to satisfy UX/UI of users. Among the display devices, flexible display devices have been actively developed.

SUMMARY

The present disclosure provides a display panel having enhanced impact resistance.

The present disclosure also provides an electronic device having improved quality of a signal obtained or received by an electronic module.

An embodiment of the inventive concept provides a display panel including: a base layer including a boundary region and a pixel region; a light-emitting element disposed on the base layer; a first shielding electrode disposed on the base layer; a first signal line disposed on the base layer and disposed on the same layer as a layer on which the first shielding electrode is disposed; a first transistor including a first input region, a first output region, a first channel region, and a first gate, and disposed on the first shielding electrode; a second transistor including a second input region, a second output region, a second channel region, and a second gate; a plurality of insulating layers having an opening corresponding to the boundary region, and disposed on the base layer; an organic layer disposed in the opening; a first connection electrode disposed on the uppermost insulating layer among the plurality of insulating layers, connected to the first signal line through a first contact hole passing through the organic layer, and connected to the second output region through a second contact hole passing through corresponding insulating layers among the plurality of insulating layers; and a second signal line disposed on a layer different from a layer on which the first signal line is disposed.

In an embodiment, the second input region may be electrically connected to the first gate.

In an embodiment, the first signal line may receive a bias voltage.

In an embodiment, the second signal line may receive a pulse signal, and a line resistance of the second signal line may be smaller than a line resistance of the first signal line.

In an embodiment, a line resistance of the second signal line may be smaller than a line resistance of the first signal line, and a line width of the first signal line may be larger than a line width of the second signal line.

In an embodiment, the display panel may further include the first shielding electrode and the second shielding electrode may be disposed on layers different from each other.

In an embodiment, the first channel region may include a polysilicon semiconductor, and the second channel region may include an oxide semiconductor.

In an embodiment, the second signal line may be electrically connected to the second gate.

In an embodiment, the display panel may further include a third transistor including a third input region, a third output region, a third channel region, and a third gate, wherein the second signal line may be electrically connected to the third gate.

In an embodiment, the third channel region and the first channel region may be disposed on the same layer, and may have an integral shape.

In an embodiment, the display panel may further include: a third signal line disposed on the base layer, and disposed on the same layer as a layer on which the first shielding electrode is disposed; a third transistor including a third input region, a third output region, a third channel region, and a third gate, and electrically connected to an anode of the light-emitting element; and a second connection electrode disposed on the uppermost inorganic insulating layer, connected to the second signal line through a third contact hole passing through the organic layer, and connected to the third output region through a fourth contact hole passing through corresponding inorganic insulating layers among the plurality of inorganic insulating layers.

In an embodiment, the third channel region and the first channel region may be disposed on the same layer, and the third channel region and the second channel region may be disposed on different layers from each other.

In an embodiment, the display panel may further include: a third transistor including a third input region, a third output region, a third channel region, and a third gate; and a third signal line disposed on the uppermost inorganic insulating layer, wherein the third signal line is electrically connected to the third output region.

In an embodiment, a portion of the second signal line may be in contact with an upper surface of the organic layer.

In an embodiment, the boundary region may include a first region extending in a first direction, and a second region extending from the first region along a second direction crossing the first direction In an embodiment of the inventive concept, a display panel may include: a base layer including a boundary region and a pixel region; a shielding electrode disposed on the base layer; a first signal line disposed on the base layer and disposed on the same layer as a layer on which the shielding electrode is disposed; a first transistor including a first input region, a first output region, a first channel region overlapping the shielding electrode, and a first gate, the first transistor being disposed on the shielding electrode; a second transistor including a second input region, a second output region, a second channel region, and a second gate; a plurality of inorganic insulating layers including an opening corresponding to the boundary region, and disposed on the base layer; an organic layer disposed in the opening; a connection electrode disposed on the uppermost inorganic insulating layer among the plurality of inorganic insulating layers and electrically connecting the first signal line and the second output region; and a second signal line at least partially disposed on the same layer as a layer on which the first gate, the second gate, or the connection electrode is disposed.

In an embodiment, the display panel may further include an upper electrode disposed on the first gate, overlapping the first gate, and defining a capacitor with the first gate.

In an embodiment, the second gate may be disposed on a layer different from a layer on which the first gate, the upper electrode, and the connection electrode are disposed.

In an embodiment, the display panel may further include a third signal line disposed on a layer different from a layer on which the first signal line and the second signal line are disposed, wherein: the second gate may be disposed on a layer different from a layer on which the first gate, the upper electrode, and the connection electrode are disposed; the second signal line may be disposed on the same layer as a layer on which the connection electrode is disposed; and the third signal line may be disposed on the same layer as a layer on which any one among the first gate, the upper electrode, and the second gate is disposed.

In an embodiment, the display panel may further include an upper electrode disposed on the first gate, overlapping the first gate, and defining the first gate and a capacitor.

In an embodiment, the second gate may be disposed on a layer different from a layer on which the first gate, the upper electrode, and the connection electrode are disposed.

In an embodiment, the display panel may further include a third signal line disposed on a layer different from a layer on which the first signal line and the second signal line are disposed, wherein: the second gate may be disposed on a layer different from a layer on which the first gate, the upper electrode, and the connection electrode are disposed; the second signal line may be disposed on the same layer as a layer on which the connection electrode is disposed; and the third signal line may be disposed on the same layer as a layer on which any one among the first gate, the upper electrode, and the second gate is disposed.

In an embodiment, each of the first signal line and the shielding electrode may include a molybdenum layer, the second signal line may include an aluminum layer, and the first signal line may receive a bias voltage, and the second signal line may receive a pulse signal.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept.

In the drawings.

DETAILED DESCRIPTION

Figure 1:
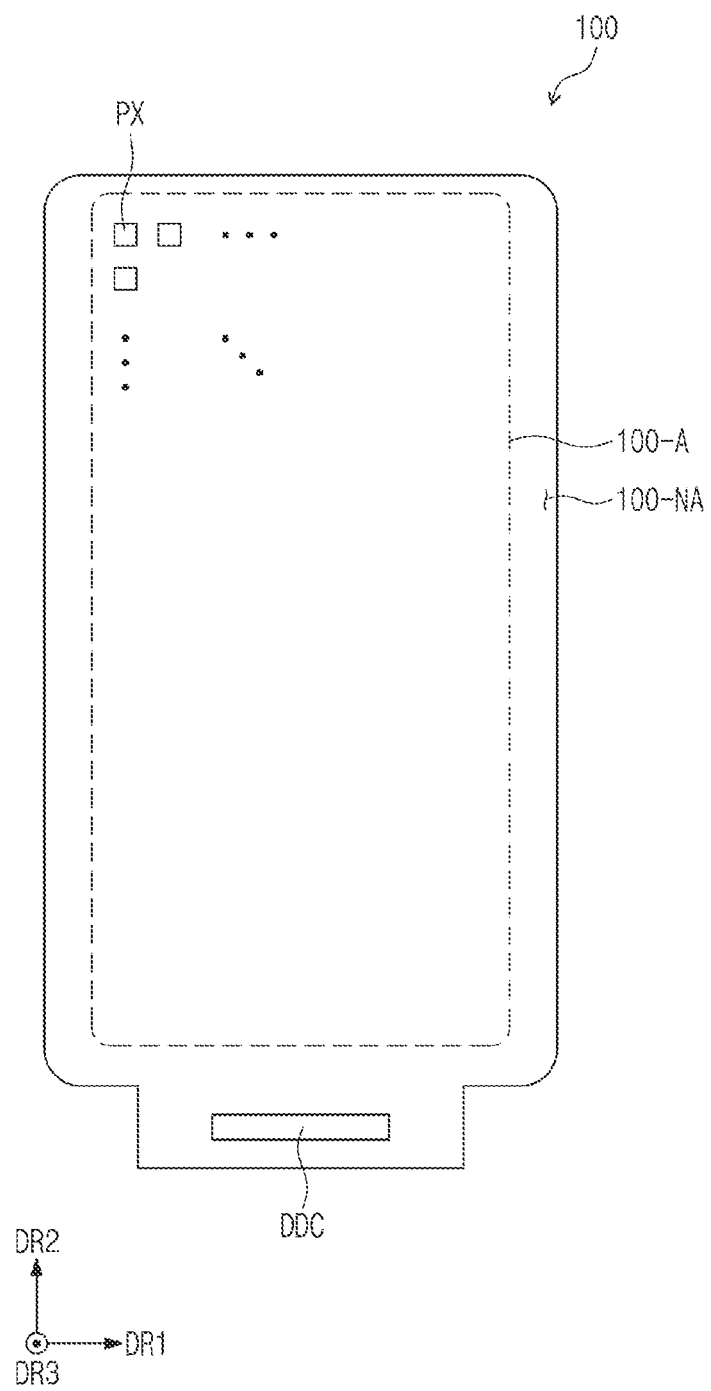
FIG. 1 is a plan view of a display panel according to an embodiment of the inventive concept.

In the present specification, when an element (or a region, a layer, a portion, etc.) is referred to as being "on," "connected to," or "coupled to" another element, it means that the element may be directly disposed on/connected to/coupled to the other element, or that a third element may be disposed therebetween.

Like reference numerals or symbols see like elements. Also, in the drawings, the thickness, the ratio, and the dimensions of elements are exaggerated for an effective description of technical contents. The term "and/or," includes all combinations of one or more of which associated configurations may define.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concept. The terms of a singular form may include plural forms unless the context clearly indicates otherwise.

In addition, terms such as "below", "lower", "above", and "upper" are used to describe the relationship between elements shown in the drawings. The terms are relative concepts and are described based on the directions indicated in the drawings.

It should be understood that the terms "comprise", or "have" are intended to specify the presence of stated features, integers, processes, operations, elements, components, or combinations thereof in the disclosure, but do not preclude the presence or addition of one or more other features, integers, processes, operations, elements, components, or combinations thereof.

Unless otherwise defined, all terms (including technical and scientific terms) used herein have the same meaning as commonly understood by one of ordinary skill in the art to which the inventive concept pertains. It is also to be understood that terms defined in commonly used dictionaries should be interpreted as having meanings consistent with the meanings in the context of the related art, and are expressly defined herein unless they are interpreted in an ideal or overly formal sense.

Hereinafter, embodiments of the inventive concept will be described with reference to the drawings.

Figure 2:
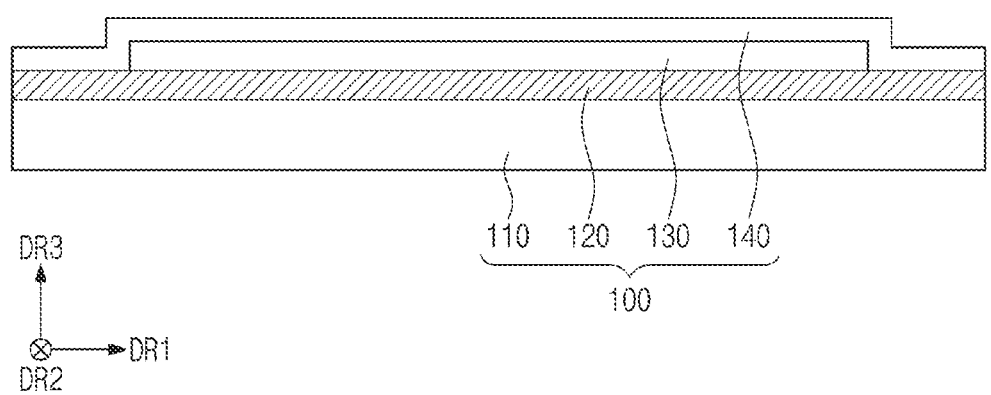
FIG. 2 is a cross-sectional view of a display panel according to an embodiment of the inventive concept.

FIG. 1 is a plan view of a display panel 100 according to an embodiment of the inventive concept. FIG. 2 is a cross-sectional view of a display panel 100 according to an embodiment of the inventive concept.

Referring to FIG. 1, the display panel 100 may include a display region 100-A and a non-display region 100-NA. The non-display region 100-NA may be adjacent to the display region 100-A and surrounds at least a portion of the display region 100-A. A pixel PX is disposed on the display region 100-A and the pixel PX is not disposed on the non-display region 100-NA. A data driving circuit DDC may be disposed on one side of the non-display region 100-NA.

The display region 100-A may include a plane defined by a first direction DR1 and a second direction DR2. The thickness direction of the display panel 100 may be a third direction DR3 that is a direction normal to the display region 100-A. A front surface (or an upper surface) and a rear surface (or a lower surface) of constituents constituting the display panel 100 may be defined with reference to third direction DR3.

The display panel 100 may be a light-emitting-type display panel and may be, for example, an organic light-emitting display panel, an inorganic light-emitting display panel, a micro-LED display panel, or a nano-LED display panel. The display panel may be foldable. The display panel 100 may be folded with reference to a folding axis which is not illustrated.

As illustrated in FIG. 2, the display panel 100 may include a base layer 110, a circuit layer 120, a light-emitting element layer 130, and an encapsulation layer 140. Another functional layer may also be further disposed between two adjacent layers among the base layer 110, the circuit layer 120, the light-emitting element layer 130, and the encapsulation layer 140.

The base layer 110 may provide a base surface on which the circuit layer 120 is disposed. The base layer 110 may be a flexible substrate that is bendable, foldable, rollable, or the like. The base layer 110 may be a glass substrate, a metal substrate, or a polymer substrate. However, an embodiment of the inventive concept is not limited thereto, and the base layer 110 may be an inorganic layer, an organic layer, or a composite material layer.

The base layer 110 may have a multi-layered structure. For example, the base layer 110 may include a first synthetic resin layer, a multi-layered or single-layered inorganic layer, and a second synthetic resin layer disposed on the multi-layered or single-layered inorganic layer. Each of the first and second synthetic resin layers may include a polyimide-based resin, and an embodiment of the inventive concept is not particularly limited thereto.

The circuit layer 120 may be disposed on the base layer 110. The circuit layer 120 may include an insulating layer, a semiconductor pattern, a conductive pattern, and a signal line, and the like.

The light-emitting element layer 130 may be disposed on the circuit layer 120. The light-emitting element layer 130 may include a light-emitting element.

For example, the light-emitting element may include an organic light-emitting material, an inorganic light-emitting material, an organic-inorganic light-emitting material, a quantum dot, a quantum rod, a micro-LED, or a nano-LED.

The encapsulation layer 140 may be disposed on the light-emitting element layer 130. The encapsulation layer 140 may protect the light-emitting element layer 130 from foreign substances such as moisture, oxygen, and dust particles. The encapsulation layer 140 may include at least one inorganic layer. The encapsulation layer 140 may include a stacked structure of an inorganic layer/organic layer/inorganic layer.

Figure 3A:
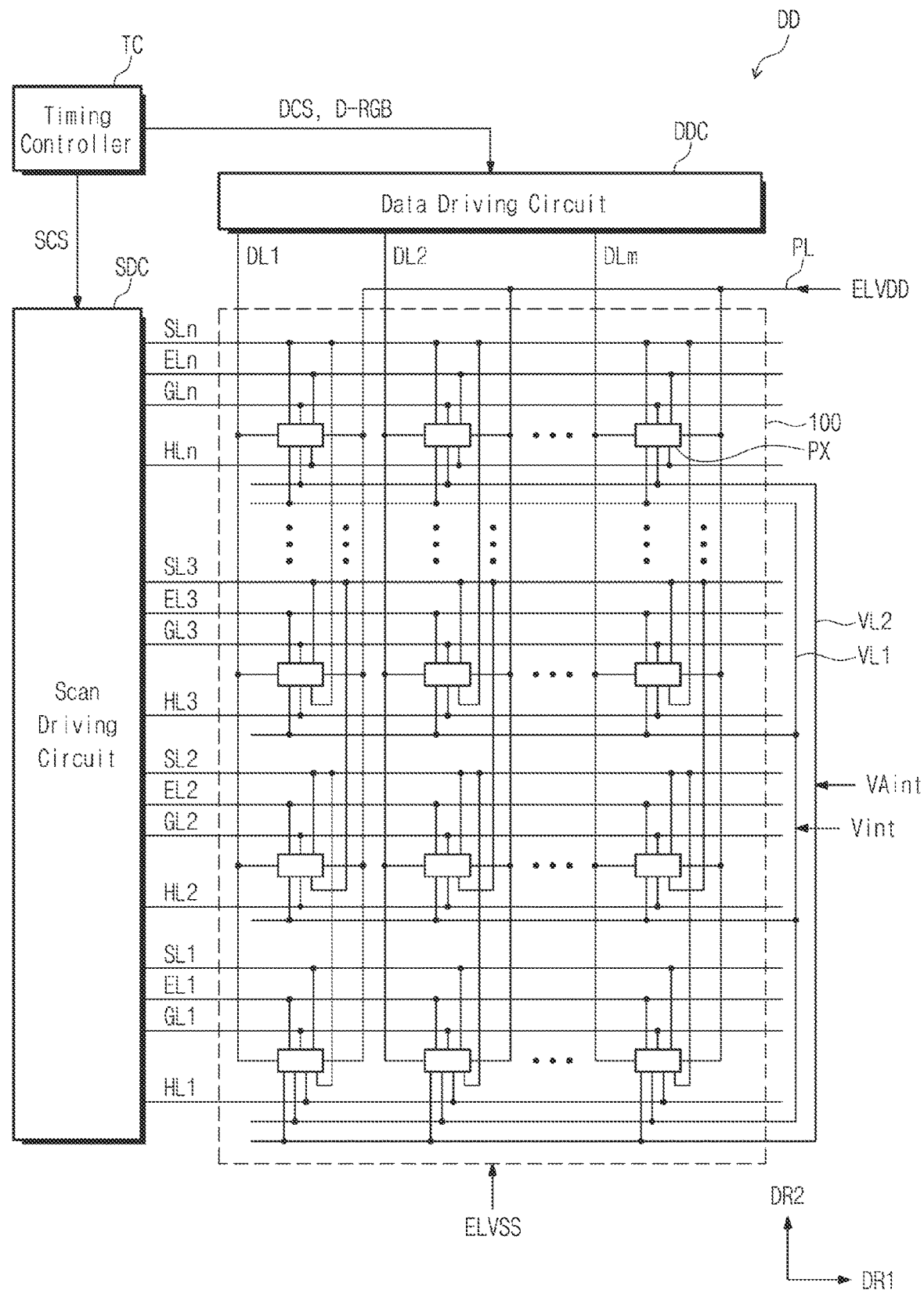
FIG. 3A is a block diagram of a display device according to an embodiment of the inventive concept.
Figure 3B:
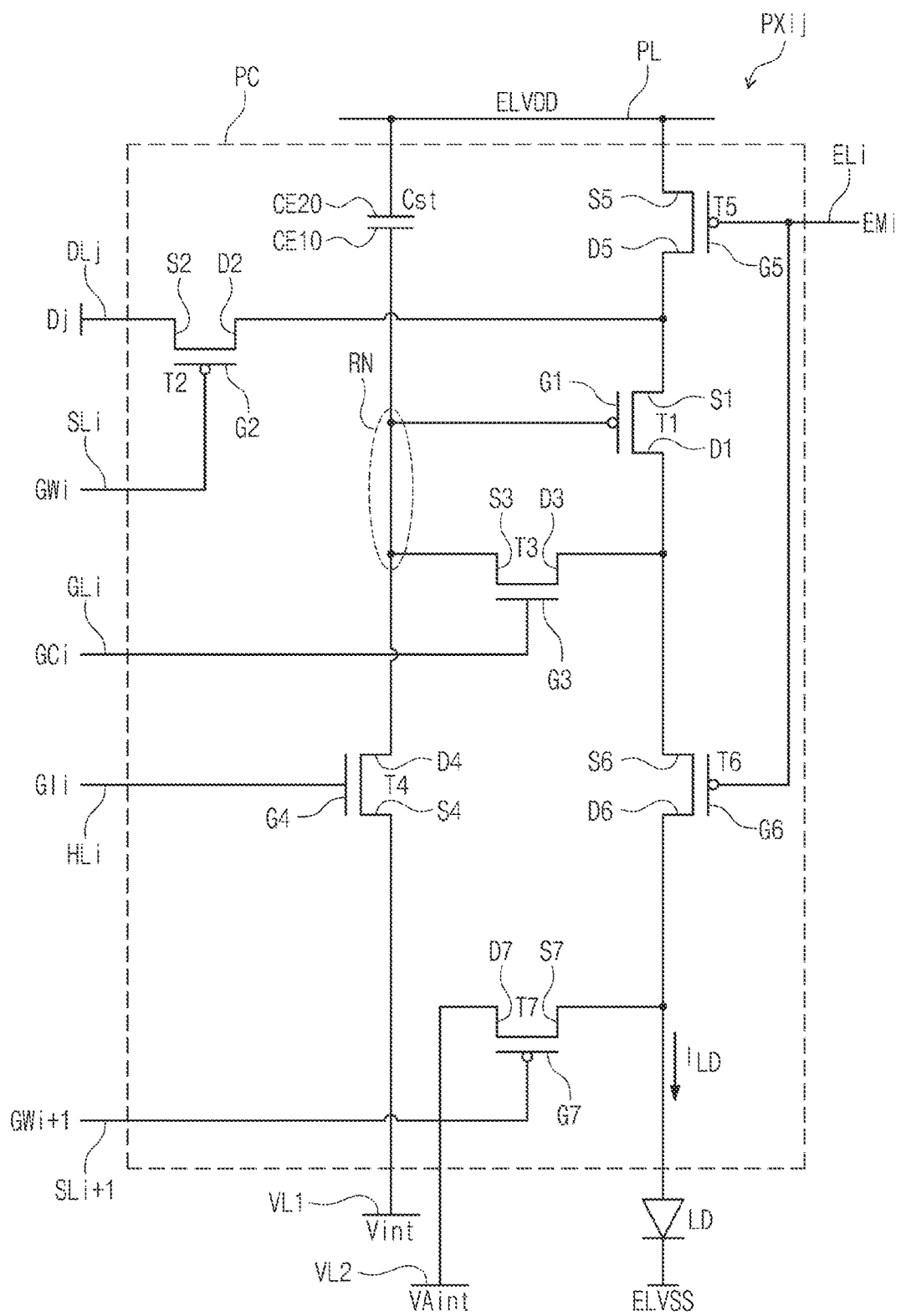
FIG. 3B is an equivalent circuit diagram of a pixel according to an embodiment of the inventive concept.
Figure 3C:
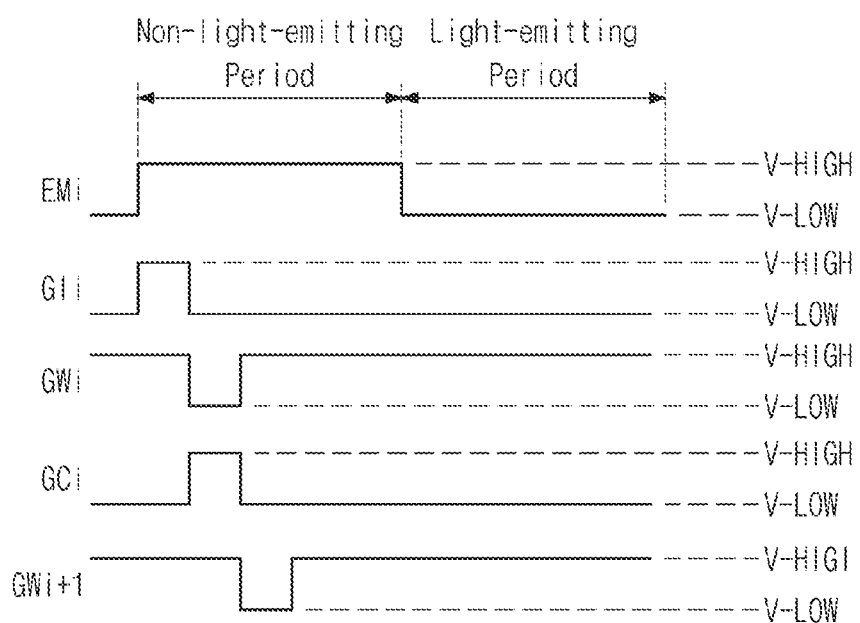
FIG. 3C is a waveform diagram of driving signals for driving a pixel according to an embodiment of the inventive concept.

FIG. 3A is a block diagram of a display device DD according to an embodiment of the inventive concept. FIG. 3B is an equivalent circuit diagram of a pixel PX according to an embodiment of the inventive concept. FIG. 3C is a waveform diagram of driving signals for driving a pixel PX according to an embodiment of the inventive concept.

The display device DD includes a timing controller TC, a scan driving circuit SDC, a data driving circuit DDC, and a display panel 100. At least one among the timing controller TC, the scan driving circuit SDC, and the data driving circuit DDC may be provided in the form of a driving chip or may be directly formed on the display panel 100.

The timing controller TC receives input image signals, converts the data format of the input image signals to satisfy an interface specification with the scan driving circuit SDC, and generates image data D-RGB. The timing controller TC outputs image data D-RGB and various control signals DCS and SCS.

The scan driving circuit SDC receives the scan control signal SCS from the timing controller TC. The scan control signal SCS may include a vertical start signal for starting the operation of the scan driving circuit SDC, a clock signal for determining output timing of the signals, and the like. The scan driving circuit SDC generates a plurality of scan signals and sequentially outputs the scan signals to corresponding signal lines SL1 to SLn, GL1 to GLn, and HL1 to HLn. In addition, the scan driving circuit SDC generates a plurality of light emission control signals in response to the scan control signal SCS and outputs the plurality of light emission control signals to corresponding light light-emitting lines ELi to ELn.

Although FIG. 3A illustrates that a plurality of scan signals and a plurality of light emission control signals are output from one scan driving circuit SDC, an embodiment of the inventive concept is not particularly limited thereto. In an embodiment of the inventive concept, a plurality of scan driving circuits may divide, generate, and output scan signals, and divide, generate, and output a plurality of emission control signals. In addition, in an embodiment of the inventive concept, a driving circuit generating and outputting a plurality of scan signals and a driving circuit generating and outputting a plurality of emission control signals may be separately provided.

The data driving circuit DDC receives the data control signal DCS and the image data D-RGB from the timing controller TC. The data driving circuit DDC converts the image data D-RGB into data signals, and outputs the data signals to a plurality of data lines DL1 to DLm to be described later. The data signals are analog voltages corresponding to gray scale values of the image data D-RGB.

The display panel 100 includes a plurality of groups of signal lines.

Hereinafter, any one of the plurality of groups of signal lines is defined as a first signal line, another may be defined as a second signal line and the other may be defined as a third signal line. Hereinafter, a name of a signal line is defined in order to distinguish a plurality of groups of signal lines.

The plurality of groups of signal lines include a first group of scan lines SL1 to SLn, a second group of scan lines GL1 to GLn, a third group of scan lines HL1 to HLn, light-emitting lines ELi to ELn, data lines DL1 to DLm, a first voltage line PL, a second voltage line VL1, and a third voltage line VL2. The first group of scan lines SL1 to SLn, the second group of scan lines GL1 to GLn, the third group of scan lines HL1 to HLn, and the light-emitting lines ELi to ELn extend in the first direction DR1 and are arranged in a second direction DR2 crossing the first direction DR1. The plurality of data lines DL1 to DLm insulatively cross the first group of scan lines SL1 to SLn, the second group of scan lines GL1 to GLn, the third group of scan lines HL1 to HLn, and the light-emitting lines ELi to ELn with at least one insulating layer disposed therebetween.

Each of the first voltage line PL, the second voltage line VL1, and the third voltage line VL2 may include at least one among a component extending in the first direction DR1 and a component extending in the second direction DR2. The structure and shape of the first voltage line PL, the second voltage line VL1, and the third voltage line VL2 may be designed independently of each other.

Each of the plurality of pixels PX is electrically connected to corresponding signal lines among the signal lines. A connection relationship between the pixels PX and the signal lines may be changed according to the configuration of the driving circuit of the pixels PX.

The first voltage line PL receives a first power voltage ELVDD. A second power voltage ELVSS is applied to the display panel 100. The second power voltage ELVSS has a lower level than the first power voltage ELVDD.

The second voltage line VL1 receives a first initialization voltage Vint. The first initialization voltage Vint has a lower level than the first power voltage ELVDD. The third voltage line VL2 receives the second initialization voltage VAint. The second initialization voltage VAint has a lower level than the first power voltage ELVDD. The first initialization voltage Vint and the second initialization voltage VAint may be a bias voltage having a constant level. The first initialization voltage Vint and the second initialization voltage VAint may have different levels. The second initialization voltage VAint may have a lower voltage than the first initialization voltage Vint.

The plurality of pixels PX may include a plurality of groups generating different color lights. For example, red pixels generating red color light, green pixels generating green color light, and blue pixels generating blue color light may be included in the plurality of pixels PX. A light-emitting diode of the red pixel, a light-emitting diode of the green pixel, and a light-emitting diode of the blue pixel may include light-emitting layers of different materials.

FIG. 3B exemplarily illustrates a pixel PXij connected to an i-th scan line SLi of the first group among the scan lines SL1 to SLn of the first group and connected to the j-th data line DLj among the plurality of data lines DL1 to DLm. The pixel PXij may include a pixel driving circuit PC (hereinafter, a pixel circuit) and a light-emitting element LD.

In an embodiment, the pixel circuit PC may include first to seventh transistors T1 to T7 and a capacitor Cst. In an embodiment, the first transistor T1, the second transistor T2, and the fifth transistor T5 to seventh transistor T7 are P-type transistors, and the third transistor T3 and the fourth transistor T4 are N-type transistors. However, an embodiment of the inventive concept is not limited thereto, and the first to seventh transistors T1 to T7 may be implemented as either a P-type transistor or an N-type transistor. An input region (or an input electrode) of an N-type transistor is described as being a drain (or a drain region), an input region of a P-type transistor is described as being a source (or a source region), and an output region (or output electrode) of an N-type transistor is described as being a source (or a source region), and an output region of a P-type transistor is described as being a drain (or a drain region). Also, in an embodiment of the inventive concept, at least one among the first to seventh transistors T1 to T7 may be omitted.

In an embodiment, the first transistor T1 may be a driving transistor, and the second transistor T2 may be a switching transistor. The capacitor Cst is electrically connected between the first voltage line PL receiving the first power voltage ELVDD and a reference node RN. The capacitor Cst includes a first electrode CE10 electrically connected to the reference node RN and a second electrode CE20 electrically connected to the first voltage line PL.

The first transistor T1 is electrically connected between the first voltage line PL and one electrode (for example, an anode) of the light-emitting element LD. The source S1 of the first transistor T1 is electrically connected to the first voltage line PL. In this specification, "being electrically connected between a transistor and a signal line or a transistor and a transistor" means that "a source, a drain, and a gate of the transistor have an integral shape with the signal line or are connected through a connection electrode." Another transistor may be disposed between the source S1 of the first transistor T1 and the first voltage line PL.

The drain D1 of the first transistor T1 is electrically connected to the anode of the light-emitting element LD. Another transistor may be disposed between the drain D1 of the first transistor T1 and the anode of the light-emitting element LD. The gate G1 of the first transistor T1 is electrically connected to the reference node RN.

The second transistor T2 is electrically connected between the j-th data line DLj and the source S1 of the first transistor T1. The source S2 of the second transistor T2 is electrically connected to the j-th data line DLj and the drain D2 of the second transistor T2 is electrically connected to the source S1 of the first transistor T1. In this embodiment, the gate G2 of the second transistor T2 may be electrically connected to the i-th scan line SLi of the first group.

The third transistor T3 is electrically connected between the reference node RN and the drain D1 of the first transistor T1. The drain D3 of the third transistor T3 is electrically connected to the drain D1 of the first transistor T1 and a source S3 of the third transistor T3 is electrically connected to the reference node RN. Although the single-gate third transistor T3 is illustrated as an example, the third transistor T3 may include a plurality of gates. In this embodiment, the gate G3 of the third transistor T3 may be electrically connected to the i-th scan line GLi of the second group. The fourth transistor T4 is electrically connected between the reference node RN and the second voltage line VL1. The drain D4 of the fourth transistor T4 is electrically connected to the reference node RN, and the source S4 of the fourth transistor T4 is electrically connected to the second voltage line VL1. Although the fourth transistor T4 of a single gate is illustrated, the fourth transistor T4 may include a plurality of gates. In this embodiment, the gate G4 of the fourth transistor T4 may be electrically connected to the i-th scan line HLi of the third group.

The fifth transistor T5 is electrically connected between the first voltage line PL and the source S1 of the first transistor T1. A source S5 of the fifth transistor T5 is electrically connected to the first voltage line PL and the drain D5 of the fifth transistor T5 is electrically connected to the source S1 of the first transistor T1. The gate G5 of the fifth transistor T5 may be electrically connected to the i-th light-emitting line ELi.

The sixth transistor T6 is electrically connected between the drain D1 of the first transistor T1 and the light-emitting element LD. A source S6 of the sixth transistor T6 is electrically connected to the drain D1 of the first transistor T1 and the drain D6 of the sixth transistor T6 is electrically connected to the anode of the light-emitting element LD. The gate G6 of the sixth transistor T6 may be electrically connected to the i-th light-emitting line ELi. In an embodiment of the inventive concept, the gate G6 of the sixth transistor T6 may be connected to a different signal line from the gate G5 of the fifth transistor T5.

The seventh transistor T7 is electrically connected between the drain D6 of the sixth transistor T6 and the third voltage line VL2. A source S7 of the seventh transistor T7 is electrically connected to the drain D6 of the sixth transistor T6 and the drain D7 of the seventh transistor T7 is electrically connected to the second voltage line VL1. A gate G7 of the seventh transistor T7 may be electrically connected to the i+1-th scan line SLi+1 of the first group.

An operation of the pixel PXij will be described in more detail with reference to FIGS. 3B and 3C. The display device DD displays an image for each frame period. During each frame period, the signal lines of each of the first group of scan lines SL1 to SLn, the second group of scan lines GL1 to GLn, the third group of scan lines HL1 to HLn, and the light-emitting lines EL1 to ELn is sequentially scanned. FIG. 3C illustrates a portion of any among frame periods.

Referring to FIG. 3C, each of the signals Ei, GIi, GWi, GCi, and GWi+1 may have a high level V-HIGH during a partial period and a low level V-LOW during a partial period. N-type transistors are turned on when a corresponding signal has the high level V-HIGH and P-type transistors are turned on when a corresponding signal has the low level V-LOW.

When the emission control signal EMi has the high level V-HIGH, the fifth transistor T5 and the sixth transistor T6 are turned off. When the fifth transistor T5 and the sixth transistor T6 are turned off, a current path is not formed between the first voltage line PL and the second power voltage ELVSS. That is, current does not flow through the light emitting element LD. Accordingly, the corresponding period may be defined as a non-light-emitting period.

When the scan signal GIi applied to the i-th scan line HLi of the third group has the high level V-HIGH, the fourth transistor T4 is turned on. When the fourth transistor T4 is turned on, the reference node RN is initialized by the first initialization voltage Vint.

When the scan signal GWi applied to the i-th scan line SLi of the first group has the low level V-LOW, and the scan signal GCi applied to the i-th scan line GLi of the second group has the high level V-HIGH, the second transistor T2 and the third transistor T3 are turned on.

Since the reference node RN is initialized to the initialization voltage Vint, the first transistor T1 is in a state of being turned on. When the first transistor T1 is turned on, a voltage corresponding to the data signal Dj (see FIG. 2) is provided to the reference node RN. Here, the capacitor Cst stores a voltage corresponding to the data signal Dj. The voltage corresponding to the data signal Dj may be a voltage reduced by a threshold voltage Vth of the first transistor T1 from the data signal Dj.

When the scan signal GWi+1 applied to the i+1-th scan line SLi+1 of the first group has the low level V-LOW, the seventh transistor T7 is turned on. As the seventh transistor T7 is turned on, the anode of the light-emitting element LD is initialized to a second initialization voltage VAint. A parasitic capacitor of the light-emitting element LD may be discharged.

When the emission control signal EMi has the low level V-LOW, the fifth transistor T5 and the sixth transistor T6 are turned on. When the fifth transistor T5 is turned on, the first power voltage ELVDD is provided to the first transistor T1. When the sixth transistor T6 is turned on, the first transistor T1 and the light-emitting element LD are electrically connected. The light-emitting element LD generates light of luminance in response to the amount of current provided.

Figure 4:
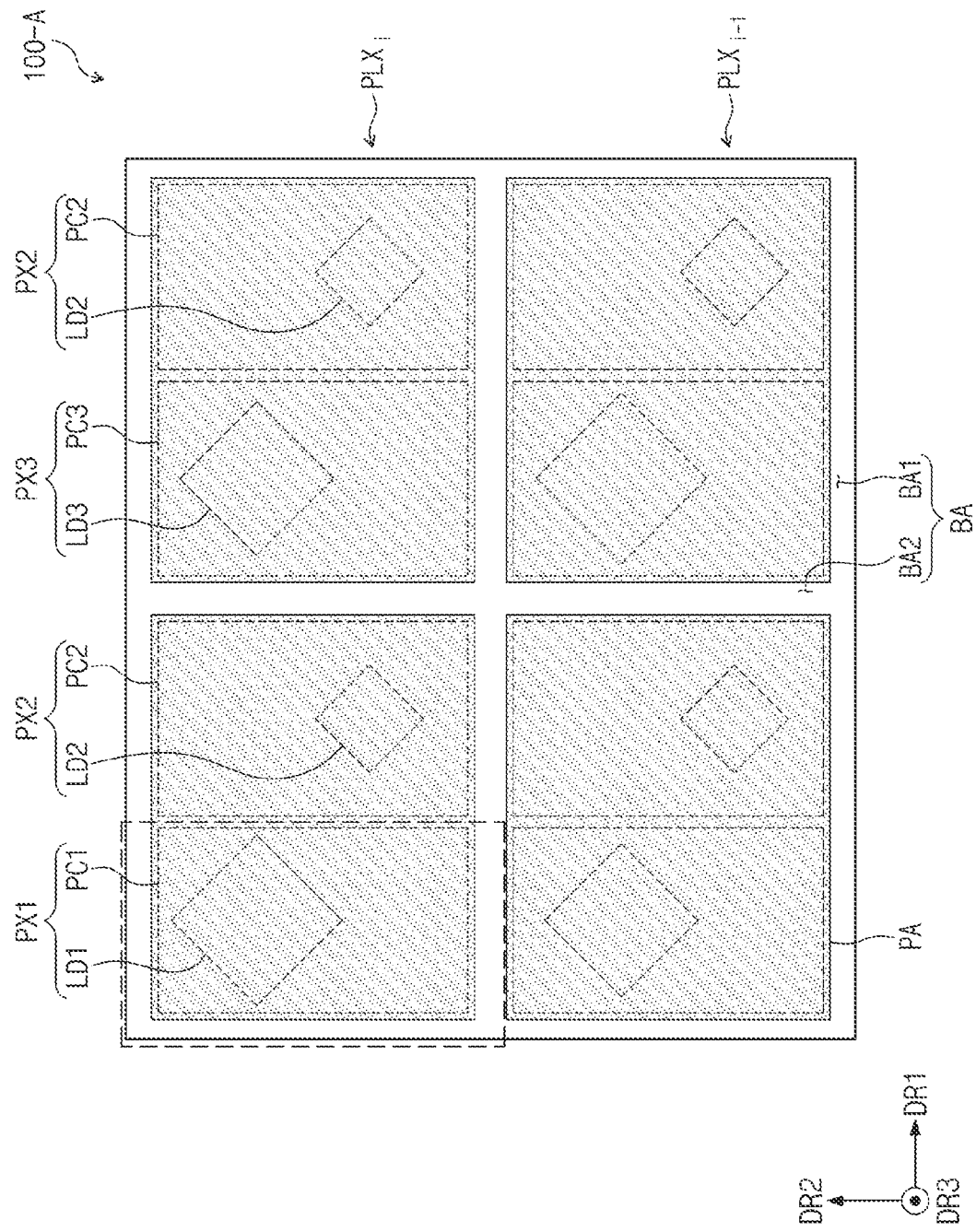
FIG. 4 is an enlarged plan view of a display panel according to an embodiment of the inventive concept.
Figure 5:
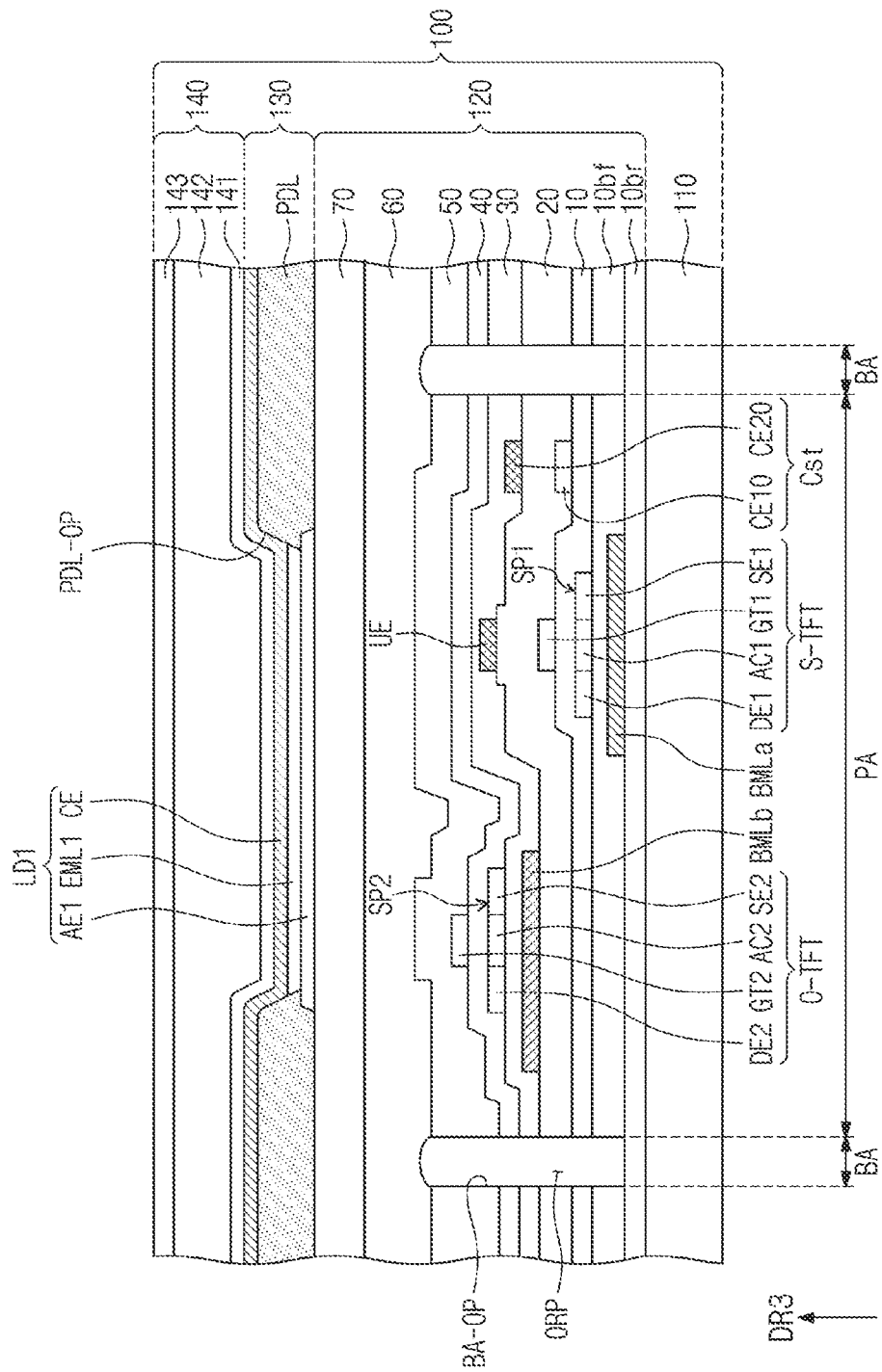
FIG. 5 is a cross-sectional view of a display panel according to an embodiment of the inventive concept.

FIG. 4 is an enlarged plan view of a display panel 100 according to an embodiment of the inventive concept. FIG. 5 is a cross-sectional view of a display panel 100 according to an embodiment of the inventive concept.

FIG. 4 illustrates two pixel rows PXLi and PXLi-1. The i-th pixel row PXLi may include a first color pixel PX1, a second color pixel PX2, a third color pixel PX3, and a second color pixel PX2 which are arranged in the first direction DR1. The i-1 th pixel row PXLi-1 may include the third color pixel PX3, the second color pixel PX2, the first color pixel PX1, and the second color pixel PX2 which are arranged in the first direction DR1. Four color pixels of the pixel rows PXLi and PXLi-1 illustrated in FIG. 4 may be repeatedly arranged along the first direction DR1. The color pixels of the pixel rows PXLi and PXLi-1 illustrated in FIG. 4 may be repeatedly arranged along the second direction DR2. In FIG. 4, anodes of a first light-emitting element LD1, a second light-emitting element LD2, and a third light-emitting element LD3 are illustrated with dotted lines.

The display region 100-A may include a plurality of pixel regions PA and a boundary region BA disposed between the plurality of pixel regions PA. Each of the plurality of pixel regions PA may include two color pixels among the first color pixel PX1, the second color pixel PX2, the third color pixel PX3. The boundary region BA may be disposed adjacent to at least a portion of each of the plurality of pixel regions PA. Referring to FIG. 4, each of the plurality of pixel regions PA may be surrounded by a boundary region. The boundary region BA may include a first region BA1 extending in the first direction and a second region BA2 extending in the second direction DR2.

The pixel circuits PC1, PC2, and PC3 of the first color pixel PX1, the second color pixel PX2, and the third color pixel PX3 are respectively disposed on the plurality of pixel regions PA. Each of the pixel circuits PC1, PC2, and PC3 is the same as the pixel circuit PC described with reference to FIG. 3B. Although it is illustrated that each of the pixel circuits PC1, PC2, and PC3 substantially is disposed in accord with the pixel region PA, an embodiment is not limited thereto.

The pixel region PA may be defined as a region other than the boundary region BA within the display region 100-A. The boundary region BA is a region in which an opening BA-OP (see FIG. 5) to be described later is disposed, and the display region 100-A that does not overlap the opening BA-OP corresponds to the pixel region PA.

FIG. 5 illustrates a silicon transistor S-TFT and an oxide transistor O-TFT of the first light-emitting element LD1 and the first pixel circuit PC1 (see FIG. 4). In the equivalent circuit illustrated in FIG. 3B, the third and fourth transistors T3 and T4 may be oxide transistors O-TFT, and the remaining transistors may be silicon transistors S-TFT. In an embodiment of the inventive concept, the pixel circuit may include only one type of transistor among a silicon transistor S-TFT and an oxide transistor O-TFT.

In this embodiment, the silicon transistor S-TFT may be the first transistor T1 in FIG. 3B, and the oxide transistor O-TFT may be the third transistor T3 in FIG. 3B.

A barrier layer 10*br* may be disposed on the base layer 110. The barrier layer 10*br* prevents foreign substances from being introduced from the outside. The barrier layer 10*br* may include at least one inorganic layer. The barrier layer 10*br* may include a silicon oxide layer and a silicon nitride layer. Each of the silicon oxide layers and the silicon nitride layers may be provided in plurality and the silicon oxide layers and the silicon nitride layers may be alternately stacked.

A first shielding electrode BMLa may be disposed on the barrier layer 10*br*.

The first shielding electrode BMLa may include a metal. The first shielding electrode BMLa may include molybdenum (Mo), a molybdenum-containing alloy, titanium (Ti), or a titanium-containing alloy which have good heat resistance. The first shielding electrode BMLa may receive a bias voltage. The first shielding electrode BMLa may receive the first power voltage ELVDD. The first shielding electrode BMLa may prevent an electrical potential caused by the polarization from affecting the silicon transistor S-TFT. The first shielding electrode BMLa may block external light from reaching the silicon transistor S-TFT. In an embodiment of the inventive concept, the first shielding electrode BMLa may be a floating electrode isolated from other electrodes or wirings.

A buffer layer 10*bf* may be disposed on the barrier layer 10*br*. The buffer layer 10*bf* may prevent diffusion of metal atoms or impurities from the base layer 110 to the upper first semiconductor pattern SP1. The buffer layer 10*bf* may include at least one inorganic layer. The buffer layer 10*bf* may include a silicon oxide layer and a silicon nitride layer.

A first semiconductor pattern SP1 may be disposed on the buffer layer 10*bf*.

The first semiconductor pattern SP1 may include a silicon semiconductor. For example, the silicon semiconductor may include amorphous silicon, polycrystalline silicon, or the like. For example, the first semiconductor pattern SP1 may include low-temperature polysilicon.

FIG. 5 merely illustrates a portion of the first semiconductor pattern SP1, and the first semiconductor pattern SP1 may be further disposed on another region. The first semiconductor pattern SP1 may be disposed in a specific rule over the pixel region PA (see FIG. 4). The first semiconductor pattern SP1 may have different electrical properties depending on whether it is doped or not. The first semiconductor pattern SP1 may include a first region having high conductivity and a second region having low conductivity. The first region may be doped with an N-type dopant or a P-type dopant. The P-type transistor includes a doped region doped with a P-type dopant and the N-type transistor may include a doped region doped with an N-type dopant. The second region may be a non-doped region or a region doped at a lower concentration than the first region.

A conductivity of the first region may be greater than a conductivity of the second region and the first region may substantially serve as an electrode or a signal line. The second region may substantially correspond to a channel region (or an active region) of the transistor. In other words, a portion of the first semiconductor pattern SP1 may be a channel of a transistor, the other portion may be the source or drain of the transistor, and another portion may be a connection electrode or a connection signal line.

The source region SE1, the channel region AC1 (or an active region), and the drain region DE1 of the silicon transistor S-TFT may be formed from the first semiconductor pattern SP1. The source region SE1 and the drain region DE1 may extend in opposite directions from the channel region AC1 in a cross-sectional view.

The first insulating layer 10 may be disposed on the buffer layer 10*bf*. The first insulating layer 10 may cover the first semiconductor pattern SP1. The first insulating layer 10 may be an inorganic layer. The first insulating layer 10 may include at least one among aluminum oxide, titanium oxide, silicon oxide, silicon nitride, silicon oxynitride, zirconium oxide, and hafnium oxide.

The first insulating layer 10 may be a single-layer silicon oxide layer. The inorganic layer of the circuit layer 120 to be described later may have a single-layer or multi-layer structure, and may include at least one of the above-described materials, but is not limited thereto.

A gate GT1 of the silicon transistor S-TFT is disposed on the first insulating layer 10. The gate GT1 may be a portion of a metal pattern. The gate GT1 overlaps the channel region AC1. In the process of doping the first semiconductor pattern SP1, the gate GT1 may be used as a self-aligned mask. The gate GT1 may include molybdenum (Mo), an alloy containing molybdenum, titanium (Ti), an alloy containing titanium, and the like which have good heat resistance, but a material of the gate GT1 is not particularly limited thereto. The gate GT1 and the first electrode CE10 of the storage capacitor Cst may be formed at the same time using the same material.

A first electrode CE10 of the storage capacitor Cst is disposed on the first insulating layer 10. Unlike illustrated in FIG. 5, the first electrode CE10 may have an integral shape with the gate GT1.

A second insulating layer 20 is disposed on the first insulating layer 10 and may cover the gate GT1 and the first electrode CE10 of the storage capacitor Cst.

An upper electrode UE overlapping the gate GT1 may be disposed on the second insulating layer 20. A second electrode CE20 overlapping the first electrode CE10 may be disposed on the second insulating layer 20. Unlike illustrated in FIG. 5, the second electrode CE20 may have an integral shape with the upper electrode UE.

The second electrode CE20 and the upper electrode UE may include molybdenum (Mo), molybdenum-containing alloy, titanium (Ti), or a titanium-containing alloy which have good heat resistance.

A second shielding electrode BMLb is disposed on the second insulating layer 20. The second shielding electrode BMLb may be disposed to correspond to the lower portion of the oxide transistor O-TFT. In an embodiment of the inventive concept, the second shielding electrode BMLb may be omitted. According to an embodiment of the inventive concept, the first shielding electrode BMLa may extend to the lower portion of the oxide transistor O-TFT to replace the second shielding electrode BMLb. The upper electrode UE, the second electrode CE20 and the second shielding electrode BMLb may be formed at the same time using the same material.

A third insulating layer 30 may be disposed on the second insulating layer 20. The second semiconductor pattern SP2 may be disposed on the third insulating layer 30. The second semiconductor pattern SP2 may include the channel region AC2 of the oxide transistor O-TFT. The second semiconductor pattern SP2 may include an oxide semiconductor. The second semiconductor pattern SP2 is a transparent conductive oxide (TCO) such as indium tin oxide (ITO), indium zinc oxide (IZO), indium gallium zinc oxide (IGZO), zinc oxide (ZnOx), or indium oxide ($In_2O_3$).

The oxide semiconductor may include a plurality of regions defined according to whether the transparent conductive oxide is reduced or not. A region in which the transparent conductive oxide is reduced (hereinafter, a reduced region) has greater conductivity than a region in which the transparent conductive oxide is not reduced (hereinafter, a non-reduced region). The reduced region substantially serves as the source/drain or signal line of the transistor. The non-reduced region substantially corresponds to the semiconductor region (or a channel) of the transistor. In other words, one portion of the second semiconductor pattern SP2 may be a semiconductor region of the transistor, another portion may be a source region/drain region of the transistor, and the other portion may be a signal transmission region.

A fourth insulating layer 40 may be disposed on the third insulating layer 30. The fourth insulating layer 40 may cover the second semiconductor pattern SP2. A gate GT2 of the oxide transistor O-TFT is disposed on the fourth insulating layer 40. The gate GT2 of the oxide transistor O-TFT may be a portion of the metal pattern. The gate GT2 of the oxide transistor O-TFT overlaps the channel region AC2. The gate GT2 may include molybdenum (Mo), a molybdenum-containing alloy, titanium (Ti), or a titanium-containing alloy which have good heat resistance. The gate GT2 may include a titanium layer and a molybdenum layer disposed on the titanium layer.

A fifth insulating layer 50 is disposed on the fourth insulating layer 40, and the fifth insulating layer 50 may cover the gate GT2. Each of the first insulating layer 10 to the fifth insulating layer 50 may be an inorganic insulating layer. In an embodiment of the present invention, at least one of the first insulating layer 10 to the fifth insulating layer 50 may include an organic layer.

In an embodiment of the present invention, the above-described buffer layer 10bf and the first to fifth insulating layers 10, 20, 30, 40, and 50 may be defined as a stacked structure of an inorganic material. An opening BA-OP is defined in the stacked structure of the inorganic material. The opening BA-OP may be disposed corresponds to the boundary region BA described with reference to FIG. 4.

Although not illustrated separately, the opening BA-OP may include a first opening region corresponding to the first region BA1 and a second opening region corresponding to the second region BA2 in a plan view.

The inorganic material multilayer structure is divided into a plurality of islands corresponding to the plurality of pixels PX1 PX2 and PX3 illustrated in FIG. 4. The formation of cracks in the stacked structure of the inorganic material due to external impact may be prevented. Because the plurality of island structures can disperse external impact.

An organic pattern or organic layer ORP may be disposed in the opening BA-OP. The organic pattern ORP fills the opening BA-OP. The organic pattern ORP may have a closed line shape in a plan view.

The first organic layer 60 may be disposed on the fifth insulating layer 50. The first organic layer 60 may cover the organic pattern ORP. The first organic layer 60 may remove a step formed in the lower inorganic layers and provide a flat top surface.

A second organic layer 70 may be disposed on the first organic layer 60.

Each of the first organic layer 60 and the second organic layer may include a general-purpose polymer such as benzocyclobutene (BCB), polyimide, hexamethyldisiloxane (HMDSO), polymethylmethacrylate (PMMA), or polystyrene (PS), a polymer derivative having a phenol-based group, an acrylic-based polymer, an imide-based polymer, an aryl ether-based polymer, an amide-based polymer, fluorine-based polymer, a p-xylene-based polymer, a vinyl alcohol-based polymer, and blends thereof.

Although not illustrated, a plurality of conductive patterns may be disposed between the fifth insulating layer 50 and the first organic layer 60. Also, a plurality of conductive patterns may be disposed between the first organic layer 60 and the second organic layer 70. A detailed description thereof will be provided later.

The first electrode AE1 of the first light-emitting element LD1 may be disposed on the second organic layer 70. The first light-emitting element LD1 may include a first electrode AE1, an emission layer EML1, and a second electrode CE (or a common electrode). The second electrode of the first light-emitting element LD1, the second light-emitting element LD2 and the third light-emitting element LD3 described with reference to FIG. 4 may have an integral shape. That is, the second electrode CE may be provided in common to the first light-emitting element LD1, the second light-emitting element LD2, and the third light-emitting element LD3.

The first electrode AE1 may be a transparent electrode, a semi-transparent electrode, or a reflective electrode. According to an embodiment of the inventive concept, the first electrode AE1 may include a reflective layer formed of Ag, Mg, Al, Pt, Pd, Au, Ni, Nd, Ir, Cr, or compounds thereof, and a transparent or semi-transparent electrode layer formed on the reflective layer. The transparent or semi-transparent electrode layer may contain at least one selected from a group consisting of an indium tin oxide (ITO), an indium zinc oxide (IZO), an indium gallium zinc oxide (IGZO), a zinc oxide (ZnO) or an indium oxide ($In_2O_3$), and an aluminum-doped zinc oxide (AZO). For example, the first electrode AE1 may include a stack structure of ITO/Ag/ITO.

The pixel defining film PDL may be disposed on the second organic layer 70. The pixel defining film PDL may have transparent properties or a light-absorbing properties. For example, the pixel defining film PDL that absorbs light may include a black coloring agent. The black coloring agent may include a black dye or a black pigment. The black coloring agent may include carbon black, a metal such as chromium, or oxide thereof. The pixel defining film PDL may correspond to a blocking pattern having light-blocking characteristics.

The pixel defining film PDL may cover a portion of the first electrode AE1.

For example, an opening PDL-OP exposing a portion of the first electrode AE1 may be defined in the pixel defining film PDL. The pixel defining film PDL may increase the distance between edges of the first electrode AE1 and the second electrode CE. Accordingly, the pixel defining film PDL may serve to prevent an arc from occurring at the edges of the first electrodes AE1.

Although not illustrated, a hole control layer may be disposed between the first electrode AE1 and the emission layer EML1. The hole control layer may include a hole transport layer and may further include a hole injection layer. An electronic control layer may be disposed between the emission layer EML1 and the second electrode CE. The electron control layer may include an electron transport layer and may further include an electron injection layer. The hole control layer and the electron control layer may be formed in common in a plurality of pixel rows PXLi and PXLi-1 (see FIG. 4) by using an open mask.

The encapsulation layer 140 may be disposed on the light-emitting element layer 130. The encapsulation layer 140 may include an inorganic layer 141, an organic layer 142, and an inorganic layer 143 that are sequentially stacked, but the layers constituting the encapsulation layer 140 are not limited thereto.

The inorganic layers 141 and 143 may protect the light-emitting element layer 130 from moisture and oxygen, and the organic layer 142 may protect the light-emitting element layer 130 from foreign substances such as dust particles. The inorganic layers 141 and 143 may include a silicon nitride layer, a silicon oxynitride layer, a silicon oxide layer, a titanium oxide layer, or an aluminum oxide layer. The organic layer 142 may include an acryl-based organic layer, but is not limited thereto.

Figure 6:
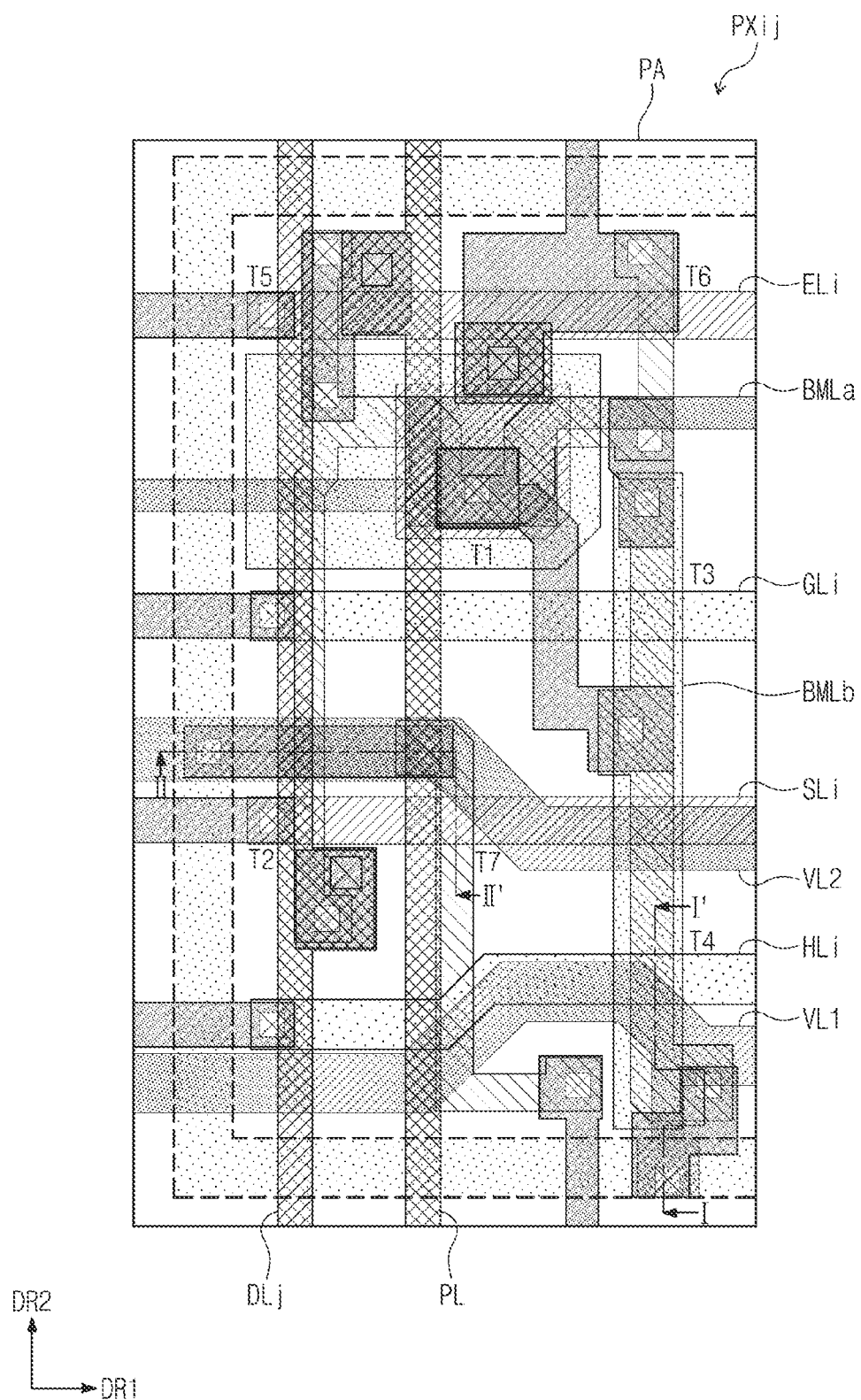
FIG. 6 is a plan view of a pixel according to embodiment of the inventive concept.

FIG. 6 is a plan view of a pixel region PA according to an embodiment of the inventive concept. FIG. 7A to FIG. 7H are plan views illustrating patterns arranged in a pixel region PA in the order of stacking.

FIG. 6 is a plan view of the pixel PXij having the equivalent circuit of FIG. 3B. FIG. 6 illustrates first to seventh transistors T1 to T7 of the pixel PXij. Also, the i-th scan line SLi of the first group, the i-th scan line GLi of the second group, the i-th scan line HLi of the third group, and the i-th emission line ELi are illustrated.

Figure 7A:
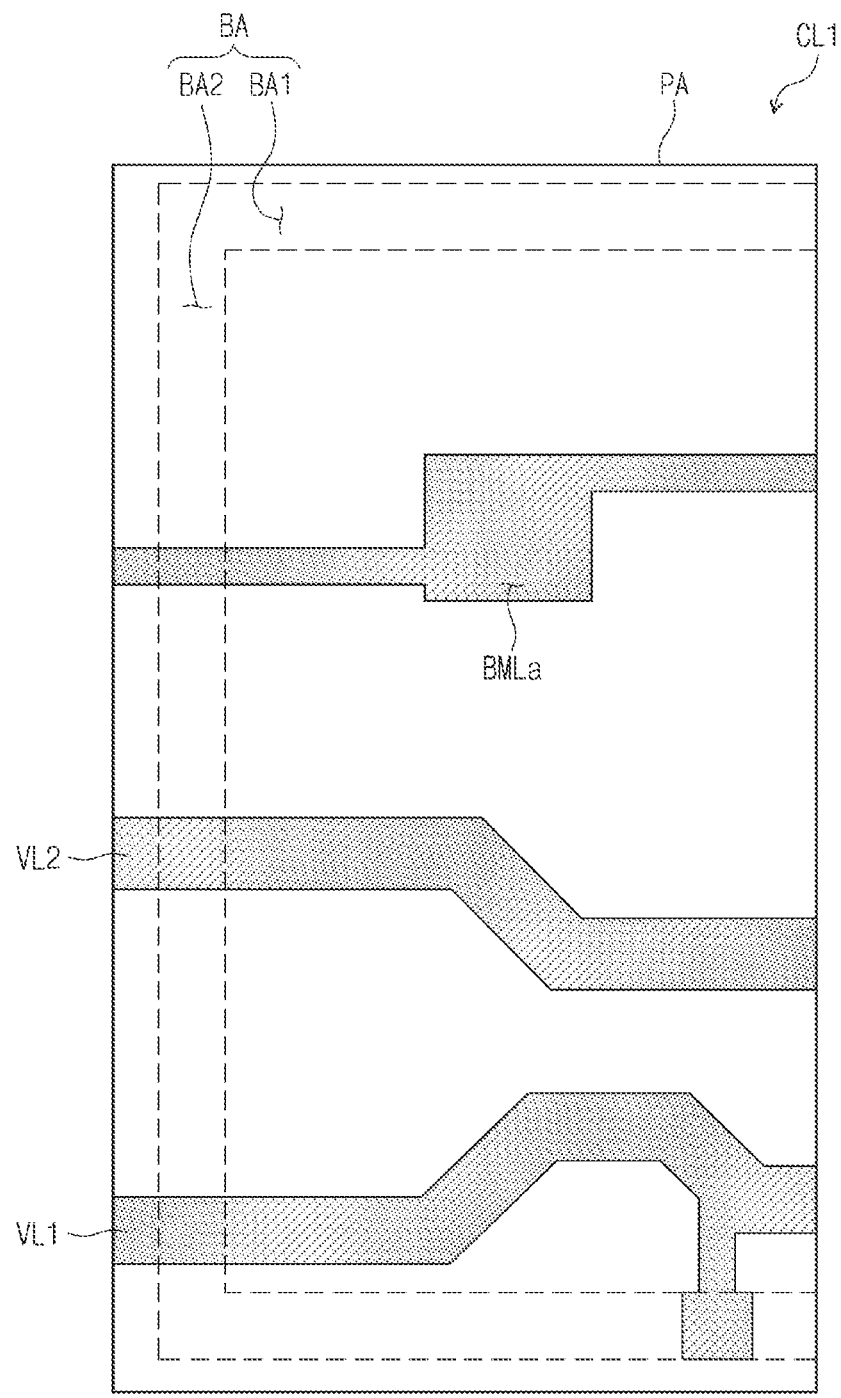
FIG. 7A, 7B, 7C, 7D, 7E, 7F, 7G and FIG. 7H are cross-sectional views illustrating patterns disposed on a pixel region in the order of stacking.

Referring to FIG. 7A, a first conductive layer CL1 is disposed on the barrier layer 10br (see FIG. 5). The first conductive layer CL1 may include a plurality of conductive patterns. The first conductive layer CL1 may include a first shielding electrode BMLa, a second voltage line VL1, and a third voltage line VL2.

Each of the first shielding electrode BMLa, the second voltage line VL1, and the third voltage line VL2 may extend in the first direction DR1. The first shielding electrode BMLa, the second voltage line VL1, and the third voltage line VL2 may overlap the boundary region BA. The first shielding electrode BMLa, the second voltage line VL1, and the third voltage line VL2 may be formed through the same process and may have the same material and the same stacked structure.

Since a relatively small number of conductive patterns are included in the first conductive layer CL1, the first shielding electrode BMLa, the second voltage line VL1, and the third voltage line VL2 may be freely designed. By increasing the line widths of the second voltage line VL1 and the third voltage line VL2, the resistances of the second voltage line VL1 and the third voltage line VL2 may be reduced. The line widths of the second voltage line VL1 and the third voltage line VL2 may be greater than the line widths of the i-th scan line SLi of the first group, the i-th scan line GLi of the second group, and the i-th scan line GLi of the third group, which will be described later.

Since the design of the second voltage line VL1 and the third voltage line VL2 is free, the range of material selection of the second voltage line VL1 and the third voltage line VL2 may be widened. Even when a material having a relatively low resistance is selected, the resistance of the second voltage line VL1 and the third voltage line VL2 can be controlled by increasing the line width. The second voltage line VL1 and the third voltage line VL2 may include molybdenum having good heat resistance even though the resistance thereof is low. The second voltage line VL1 and the third voltage line VL2 including molybdenum may not be damaged in a subsequent high-temperature process.

Unlike a signal line receiving an pulse signal, the second voltage line VL1 and the third voltage line VL2 receiving the bias voltage do not have a signal-delay so that the second voltage line VL1 and the third voltage line VL2 may be freely designed.

Figure 7B:
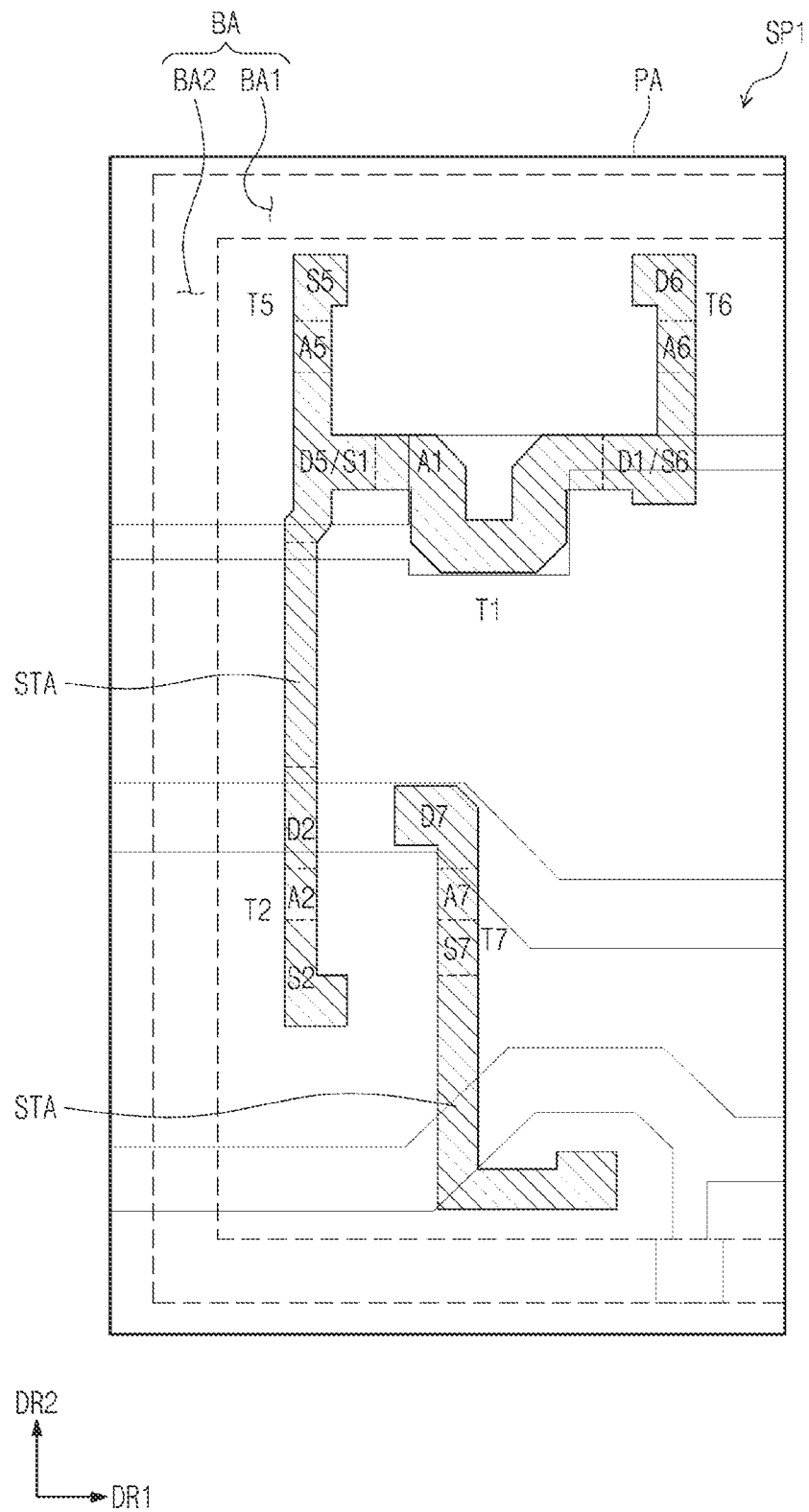

Referring to FIG. 7B, a first semiconductor pattern SP1 is disposed on the buffer layer 10bf and the first conductive layer CL1 (see FIG. 5). Two first semiconductor patterns SP1 are illustrated as an example.

The first semiconductor pattern SP1 may include a plurality of regions having different doping concentrations. The first semiconductor pattern SP1 may include source regions S1, S2, S5, S6, and S7, channel regions A1, A2, A5, A6, and A7, and drain regions D1, D2, D5, D6, and D7 of the first, second, fifth, sixth, and seventh transistors T1, T2, T5, T6, and T7. The first semiconductor pattern SP1 may further include a signal transmission region STA. The source regions S1, S2, S5, S6, and S7 and the drain regions D1, D2, D5, D6, and D7 respectively correspond to the source regions S1, S2, S5, S6, and S7 and drain regions D1, D2, D5, D6, and D7 described with reference to FIG. 3B.

In FIG. 7B, source regions S1, S2, S5, S6, and S7 and drain regions D1, D2, D5, D6, and D7 of adjacent semiconductor regions are separately illustrated. In addition, although the signal transmission region STA is additionally illustrated, an embodiment of the inventive concept is not limited thereto. Substantially, the signal transmission region STA is a region having the same doping concentration as the source regions S1, S2, S5, S6, and S7 or the drain regions D1, D2, D5, D6, and D7, and may not be distinguished with the source regions S1, S2, S5, S6, and S7 or the drain regions D1, D2, D5, D6, and D7.

Figure 7C:
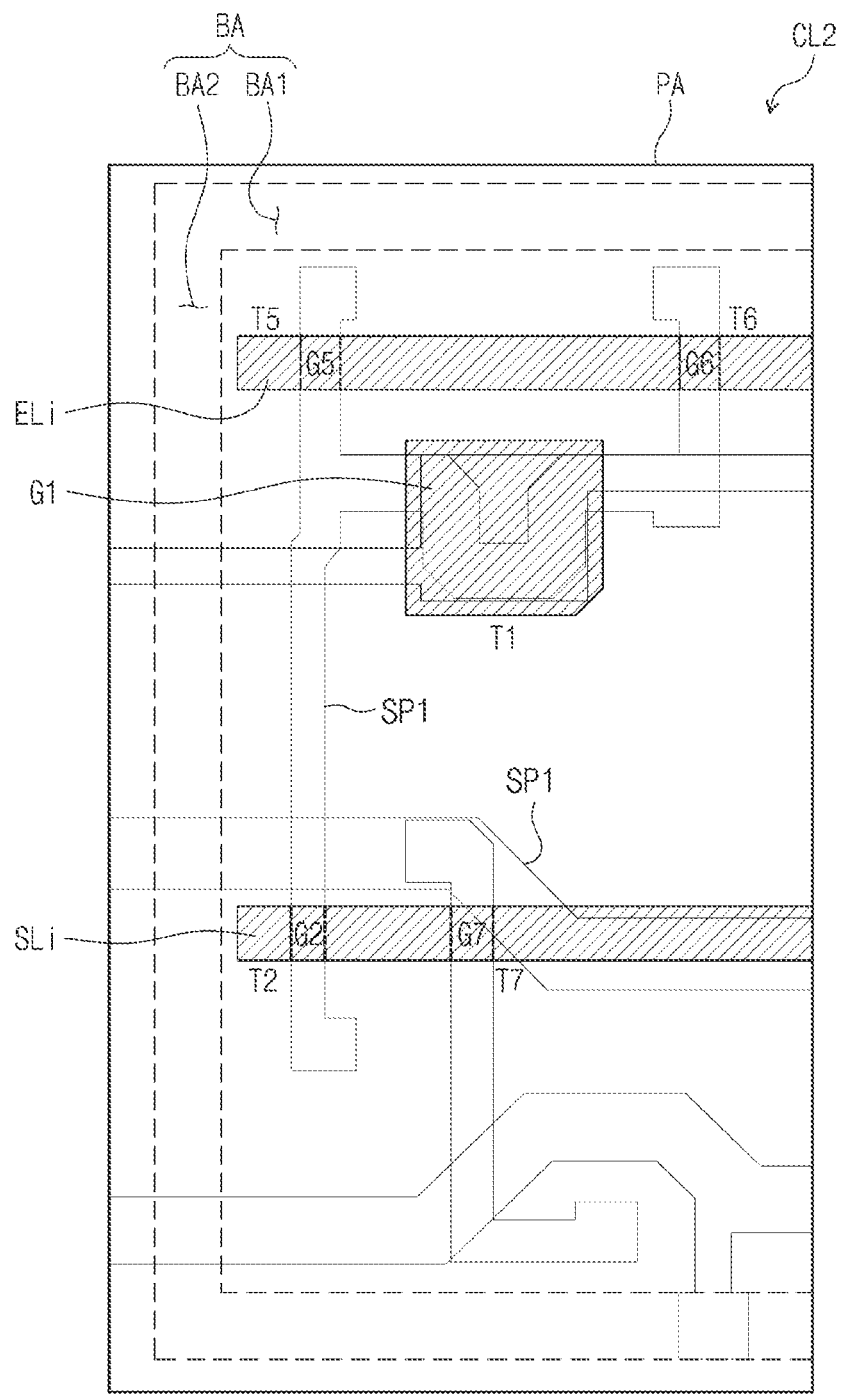

Referring to FIG. 7C, a second conductive layer CL2 is disposed on the first insulating layer 10 (see FIG. 5). The second conductive layer CL2 may include a plurality of conductive patterns.

The second conductive layer CL2 may include a gate G1 of the first transistor T1, an i-th scan line SLi of the first group, and an i-th emission line ELi. The i-th scan line SLi and the i-th emission line ELi of the first group are not disposed on the boundary region BA (see FIG. 4). As will be described later, each of the i-th scan line SLi and the i-th emission line ELi of the first group adjacent to each other may be connected to each other through connection electrodes which pass through the boundary region BA, respectively. Referring to FIG. 4, in the i-th scan line SLi of the first group corresponding to the i-th pixel row PXLi, line portions are disposed on each of the plurality of pixel regions PA arranged in the first direction DR1, the connection electrode connects two adjacent line portions among the line portions arranged in the first direction DR1.

A portion of the i-th scan line SLi of the first group overlapping the first semiconductor pattern SP1 may be the gate G2 of the second transistor T2, and another portion of the i-th scan line SLi of the first group overlapping the first semiconductor pattern SP1 may be the gate G7 of the seventh transistor T7. The seventh transistor T7 initializes the light-emitting element of the i−1 th pixel row PXLi-1 (see FIG. 4). The light-emitting element of the i-th pixel row PXLi (see FIG. 4) may be initialized by a seventh transistor T7 disposed on the i+1-th pixel row which is not illustrated.

A portion of the i-th light-emitting line ELi overlapping the first semiconductor pattern SP1 may be the gate G5 of the fifth transistor T5 and the other portion overlapping the first semiconductor pattern SP1 may be a sixth gate G6 of the transistor T6.

After the conductive pattern of the second conductive layer CL2 is formed, a doping process may be performed on the first semiconductor pattern SP1 (see FIG. 7C). The source regions S1, S2, S5, S6, and S7, the channel regions A1, A2, A5, A6, and A7, and the drain regions D1, D2, D5, D6, and D7 illustrated in FIG. 7B are distinguished by means of a doping process.

Figure 7D:
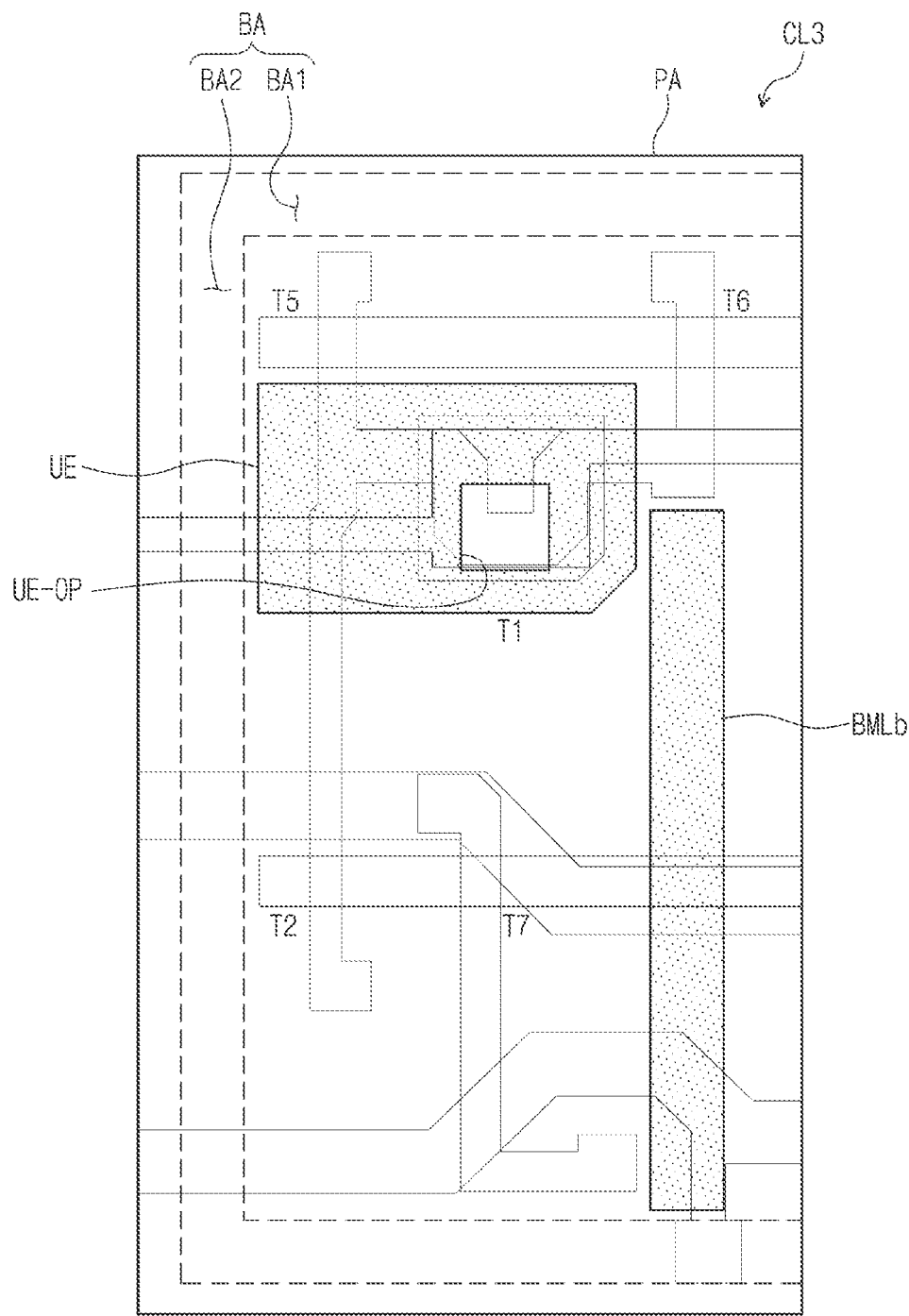

Referring to FIG. 7D, a third conductive layer CL3 is disposed on the second insulating layer 20 (see FIG. 5). The third conductive layer CL3 may include an upper electrode UE. An opening UE-OP may be defined in the upper electrode UE. The third conductive layer CL3 may further include a second shielding electrode BMLb.

Figure 7E:
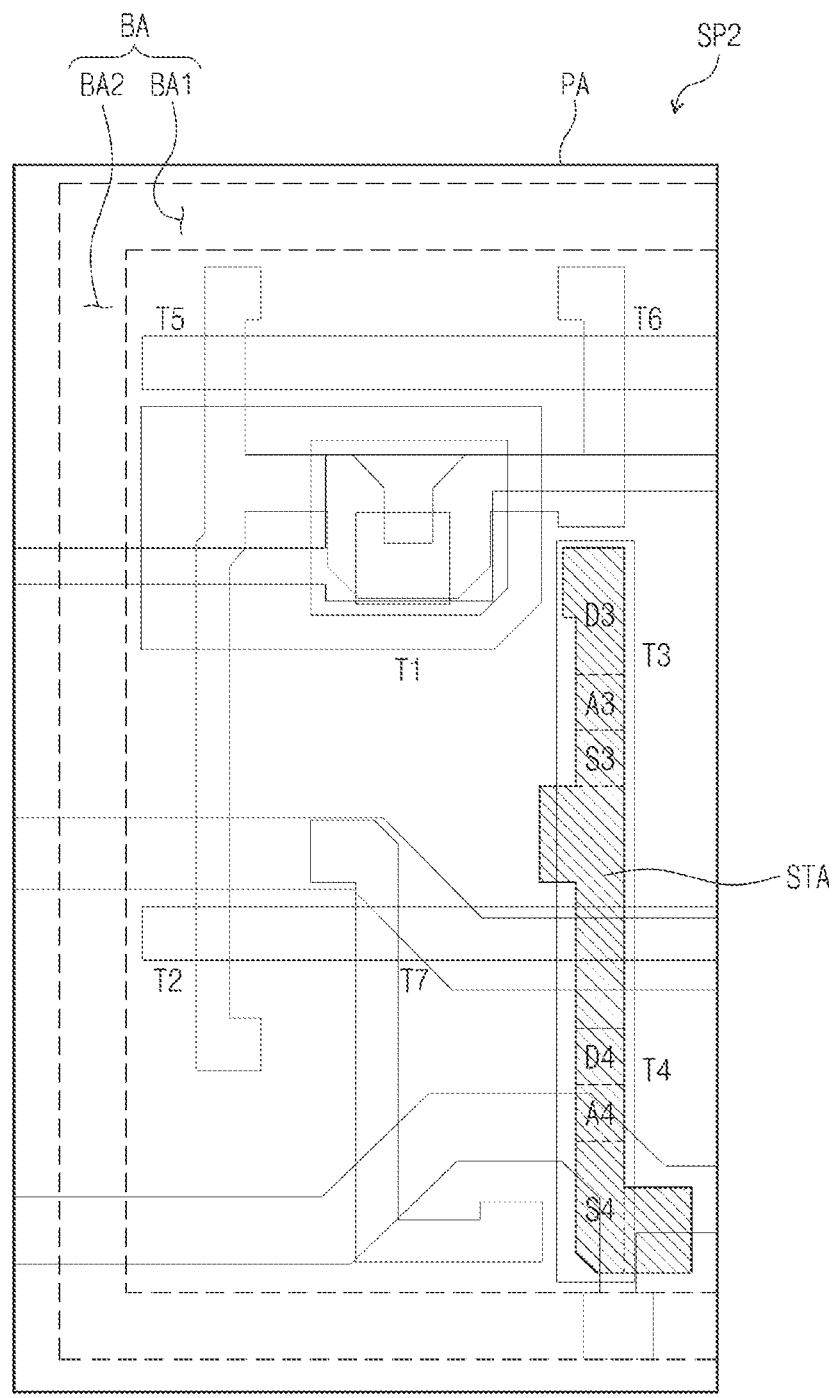

Referring to FIG. 7E, a second semiconductor pattern SP2 is disposed on the third insulating layer 30 (see FIG. 5). One second semiconductor pattern SP2 is illustrated as an example.

The second semiconductor pattern SP2 may include a plurality of regions distinguished according to whether or not the metal oxide is reduced. The second semiconductor pattern SP2 may include source regions S3 and S4, channel regions A3 and A4, and drain regions D3 and D4 of the third and fourth transistors T3 and T4.

Figure 7F:
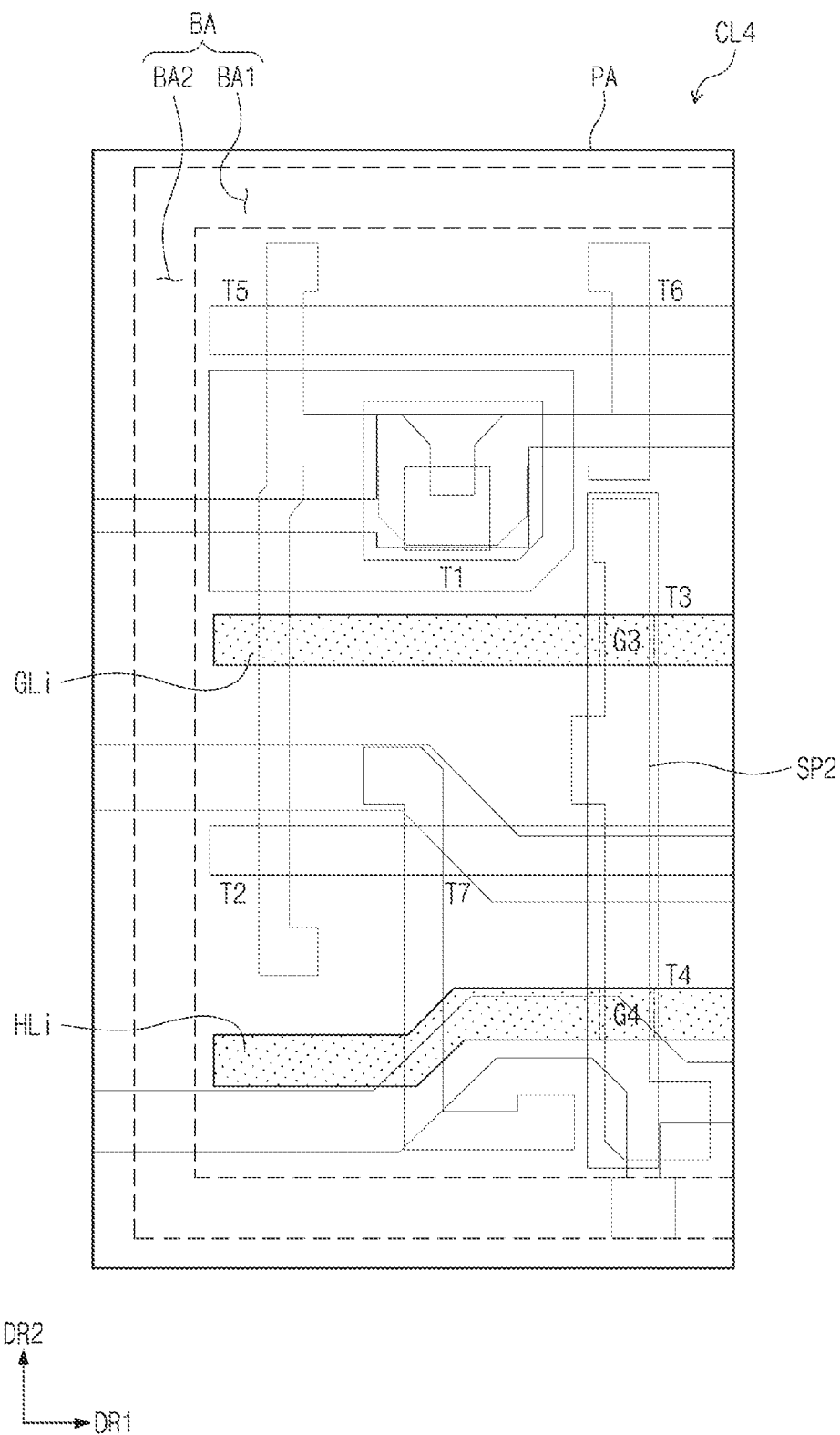

Referring to FIG. 7F, a fourth conductive layer CL4 is disposed on the fourth insulating layer 40 (see FIG. 5). The fourth conductive layer CL4 may include a plurality of conductive patterns.

The fourth conductive layer CL4 may include the i-th scan line GLi of the second group and the i-th scan line HLi of the third group. The i-th scan line GLi of the second group and the i-th scan line HLi of the third group are not disposed on the boundary region BA (see FIG. 4). As will be described later, each of the i-th scan line GLi of the second group and the i-th scan line HLi of the third group adjacent to each other may be connected to each other through connection electrodes which pass through the boundary region BA, respectively.

A portion of the i-th scan line GLi of the second group may be the gate G3 of the third transistor T3, and a portion of the i-th scan line HLi of the third group may be the gate G4 of the fourth transistor T4. After the conductive pattern of the fourth conductive layer CL4 is formed, a doping process (or reduction process) may be performed on the second semiconductor pattern SP2.

Figure 7G:
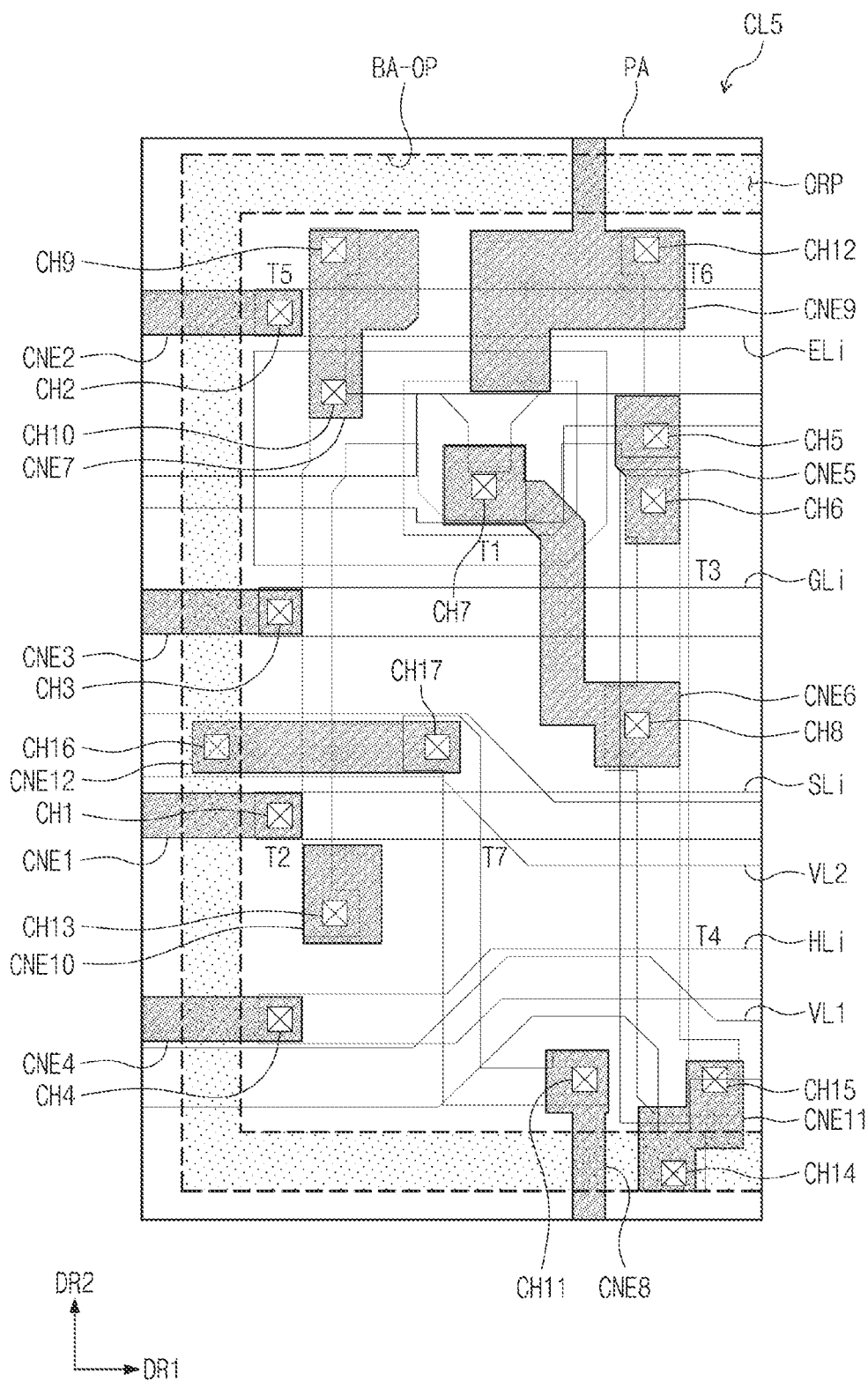

Referring to FIG. 7G, a fifth conductive layer CL5 is disposed on the fifth insulating layer 50 (see FIG. 5). The fifth conductive layer CL5 may include a plurality of conductive patterns.

Before forming the fifth conductive layer CL5, an opening BA-OP may be formed to correspond to the boundary region BA illustrated in FIGS. 4 and 5, and an organic pattern ORP may be formed in the opening BA-OP. The opening BA-OP is illustrated in bold dashed lines.

The first connection electrode CNE1 may be connected to the i-th scan line SLi of the first group through the first contact hole CH1. The second connection electrode CNE2 may be connected to the i-th light-emitting line ELi through the second contact hole CH2. The third connection electrode CNE3 may be connected to the i-th scan line GLi of the second group through the third contact hole CH3. The fourth connection electrode CNE4 may be connected to the i-th scan line HLi of the third group through the fourth contact hole CH4. The first contact hole CH1 to the fourth contact hole CH4 may pass through the inorganic layer disposed on the corresponding scan line, and may have different depths depending on the contact hole.

The fifth connection electrode CNE5 connects the drain region D1 of the first transistor T1 (see FIG. 7B) and the drain region D3 (see FIG. 7E) of the third transistor T3 through the fifth contact hole CH5 and the sixth contact hole CH6.

The sixth connection electrode CNE6 connects the gate G1 (see FIG. 7B) of the first transistor T1 and the source region S3 (see FIG. 7E) of the third transistor T3 through the seventh contact hole CH7 and the eighth contact hole CH8. The seventh connection electrode CNE7 connects the source region S5 (see FIG. 7B) of the fifth transistor T5 and the upper electrode UE (see FIG. 7D) through the ninth contact hole CH9 and the tenth contact hole CH10.

The eighth connection electrode CNE8 is connected to the source region S7 (see FIG. 7B) of the seventh transistor T7 through the eleventh contact hole CHi1. The eighth connection electrode CNE8 is electrically connected to the anode of the light-emitting element of the i–1 th pixel row PXLi-1. The ninth connection electrode CNE9 is connected to the drain region D6 (see FIG. 7B) of the sixth transistor T6 through the twelfth contact hole CH12. The ninth connection electrode CNE9 is connected to the source region of the seventh transistor of the i+1th pixel row, which is not illustrated). The tenth connection electrode CNE10 is connected to the source region S2 (see FIG. 7B) of the second transistor T2 through the thirteenth contact hole CH13.

The eleventh connection electrode CNE11 connects the second voltage line VL1 and the source region S4 (see FIG. 7E) of the fourth transistor T4 through the fourteenth contact hole CH14 and the fifteenth contact hole CH15. The twelfth connection electrode CNE12 connects the third voltage line VL2 and the drain region D7 (see FIG. 7B) of the seventh transistor through the sixteenth contact hole CH16 and the seventeenth contact hole CH17.

The first to twelfth connection electrodes CNE1 to CNE12 formed from the fifth conductive layer CL5 may include an aluminum layer having relatively high conductivity. The first to twelfth connection electrodes CNE1 to CNE12 may further include a titanium layer disposed on an aluminum layer. The titanium layer corresponds to the protective layer of the aluminum layer.

Figure 7H:
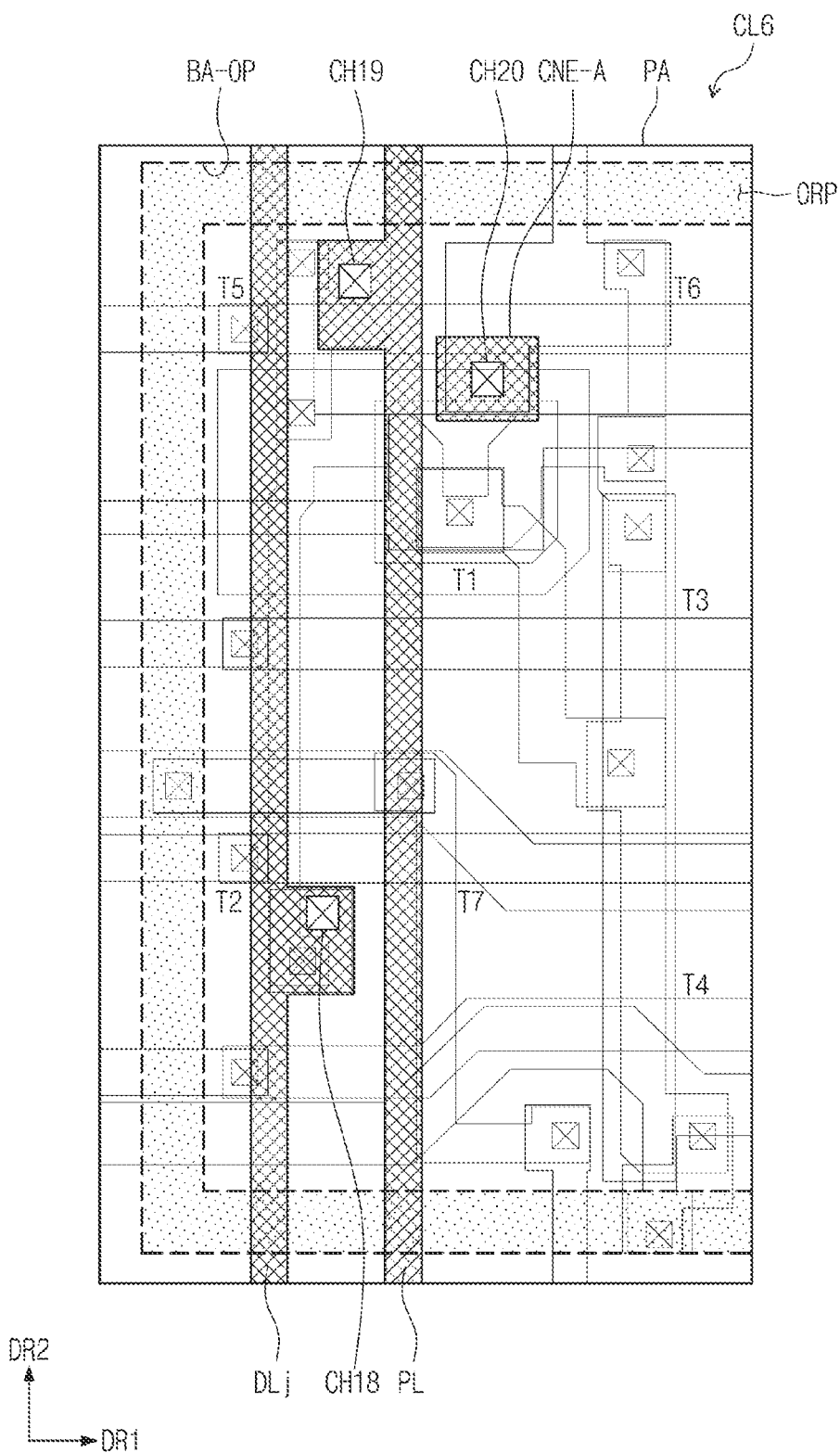

Referring to FIG. 7H, a sixth conductive layer CL6 is disposed on the first organic layer 60 (see FIG. 5). The sixth conductive layer CL6 may include a plurality of conductive patterns. The sixth conductive layer CL6 may include a data line DLj, a first voltage line PL, and a thirteenth connection electrode CNE-A.

Each of the data line DLj and the first voltage line PL extends in the second direction DR2.

The data line DLj is connected to the tenth connection electrode CNE10 (see FIG. 7G) through the eighteenth contact hole CH18. The first voltage line PL is connected to the seventh connection electrode CNE7 (see FIG. 7G) through the 19th contact hole CH19. The thirteenth connection electrode CNE-A is connected to the ninth connection electrode CNE9 through the twentieth contact hole CH20. The eighteenth contact hole CHi8 to the twentieth contact hole CH20 pass through the first organic layer 60 (see FIG. 5).

Although not illustrated, the first electrode AE1 (see FIG. 5) may be disposed on the second organic layer 70 (see FIG. 5), and connected to a thirteenth connection electrode CNE-A through the contact hole passing through the second organic layer 70 (see FIG. 5).

Figure 8A:
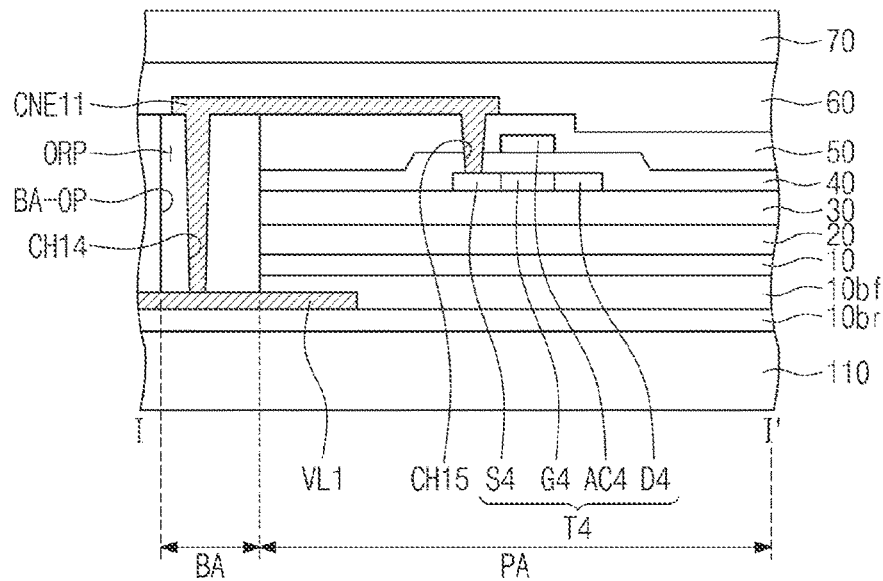
FIG. 8A is a cross-sectional view corresponding to I-I' in FIG. 6.
Figure 8B:
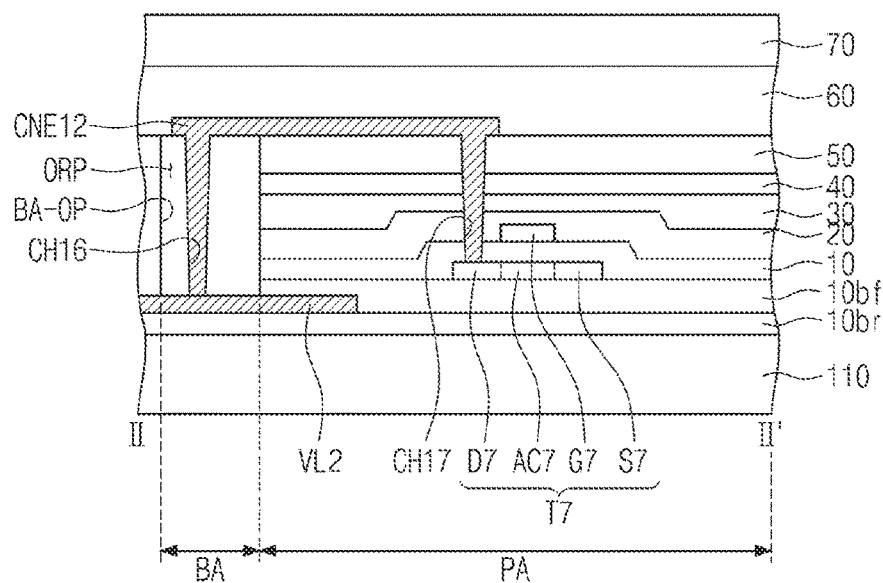
FIG. 8B is a cross-sectional view corresponding to II-II' in FIG. 6.

FIG. 8A is a cross-sectional view corresponding to I-I' of FIG. 6. FIG. 8B is a cross-sectional view corresponding to II-II' of FIG. 6.

Referring to FIG. 8A, the fourteenth contact hole CH14 overlaps the boundary region BA. The fourteenth contact hole CH14 exposes the second voltage line VL1 overlapping the boundary region BA. The eleventh connection electrode CNE11 is electrically connected to the second voltage line VL1 through the fourteenth contact hole CH14. The eleventh connection electrode CNE11 may be disposed on the organic pattern ORP and the fifth insulating layer 50. The fifteenth contact hole CH15 may pass through the fourth and fifth insulating layers 40 and 50.

Referring to FIG. 8B, the sixteenth contact hole CH16 overlaps the boundary region BA. The sixteenth contact hole CH16 exposes the third voltage line VL2 overlapping the boundary region BA. The twelfth connection electrode CNE12 is electrically connected to the third voltage line VL2 through the sixteenth contact hole CH16. The twelfth connection electrode CNE12 may be disposed on the organic pattern ORP and the fifth insulating layer 50. The seventeenth contact hole CH17 may pass through the first to fifth insulating layers 10 to 50.

FIG. 8A and FIG. 8B, the fourteenth contact hole CH14 and the sixteenth contact hole CH16 overlap the boundary region BA, so that the degree of freedom on design of a pixel region PA may be increased. The higher the resolution of the display panel, the smaller the area of the pixel region PA is. By forming contact holes not to overlap the pixel region PA like the fourteenth contact hole CH14 and the sixteenth contact hole CH16, the area of the other contact hole may be increased or the position of the other contact hole may be changed.

Figure 9A:
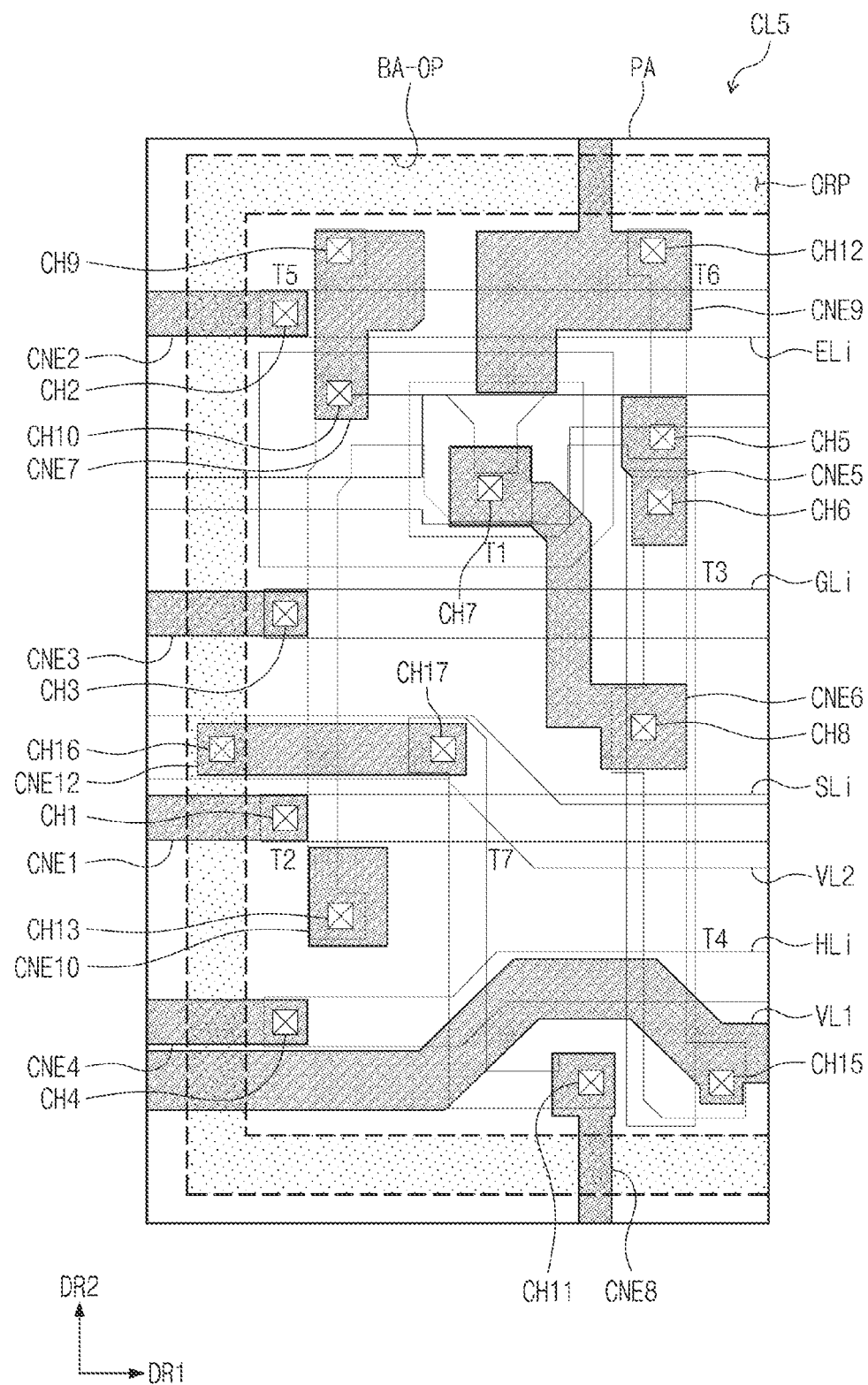
FIG. 9A, and FIG. 9B are plan views of a fifth conductive layer of a display panel according to an embodiment of the inventive concept.
Figure 9B:
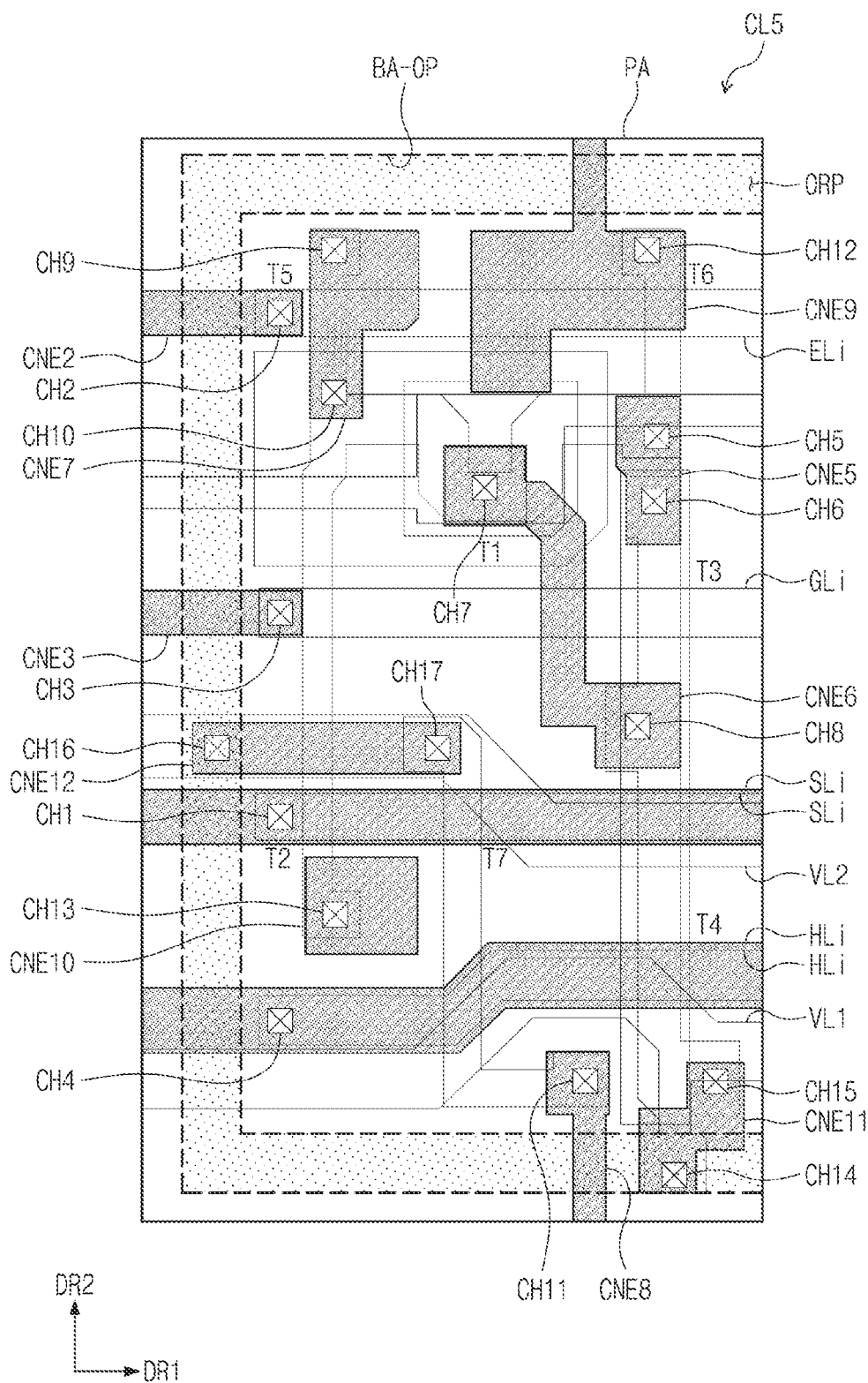

FIG. 9A and FIG. 9B are plan views of the fifth conductive layer CL5 of the pixel region PA according to an embodiment. FIG. 9A and FIG. 9B illustrate plan views corresponding to FIG. 7G.

Referring to FIG. 9A, the fifth conductive layer CL5 may further include a second voltage line VL1. Unlike FIG. 7A, the second voltage line VL1 may be disposed on the fifth conductive layer CL5. Unlike FIG. 7G, the eleventh connection electrode CNE11 and the fourteenth contact hole CH14 may be omitted. According to an embodiment of the inventive concept, six types of signal lines SLi, ELi, GLi, HLi, VL1, and VL2 may be formed from the first conductive layer CL1 of FIG. 7A, the second conductive layer CL2 of FIG. 7C, the fourth conductive layer CL4 of FIG. 7F, and the fifth conductive layer CL5 of FIG. 9A.

Although not illustrated, the fifth conductive layer CL5 may further include a third voltage line VL3. Here, unlike FIG. 7G, the twelfth connection electrode CNE12 and the sixteenth contact hole CH16 may be omitted.

Referring to FIG. 9B, the fifth conductive layer CL5 may further include an i-th scan line SLi of a first group and an i-th scan line HLi of a third group. Unlike FIG. 7G, the first connection electrode CNE1 and the fourth connection electrode CNE4 may be omitted.

The i-th scan line SLi of the first group of the second conductive layer CL2 illustrated in FIG. 7C and the i-th scan line SLi of the first group of the fifth conductive layer CL5 illustrated in FIG. 9B may have the double wiring design.

The i-th scan line HLi of the third group of the fourth conductive layer CL4 illustrated in FIG. 7F and the i-th scan line HLi of the third group of the fifth conductive layer CL5 illustrated in FIG. 9B may have the double wiring design.

As described with reference to FIG. 3C, since the i-th scan line SLi of the first group and the i-th scan line HLi of the third group receive a pulse signal, it is preferable to have low line-resistance in order to reduce signal-delay. Line-resistance is measured at the same line width, the same thickness, and the same length. A signal delay may be reduced by forming the i-th scan line SLi of the first group and the i-th scan line HLi of the third group from the fifth conductive layer CL5 having a low resistance.

Figure 10A:
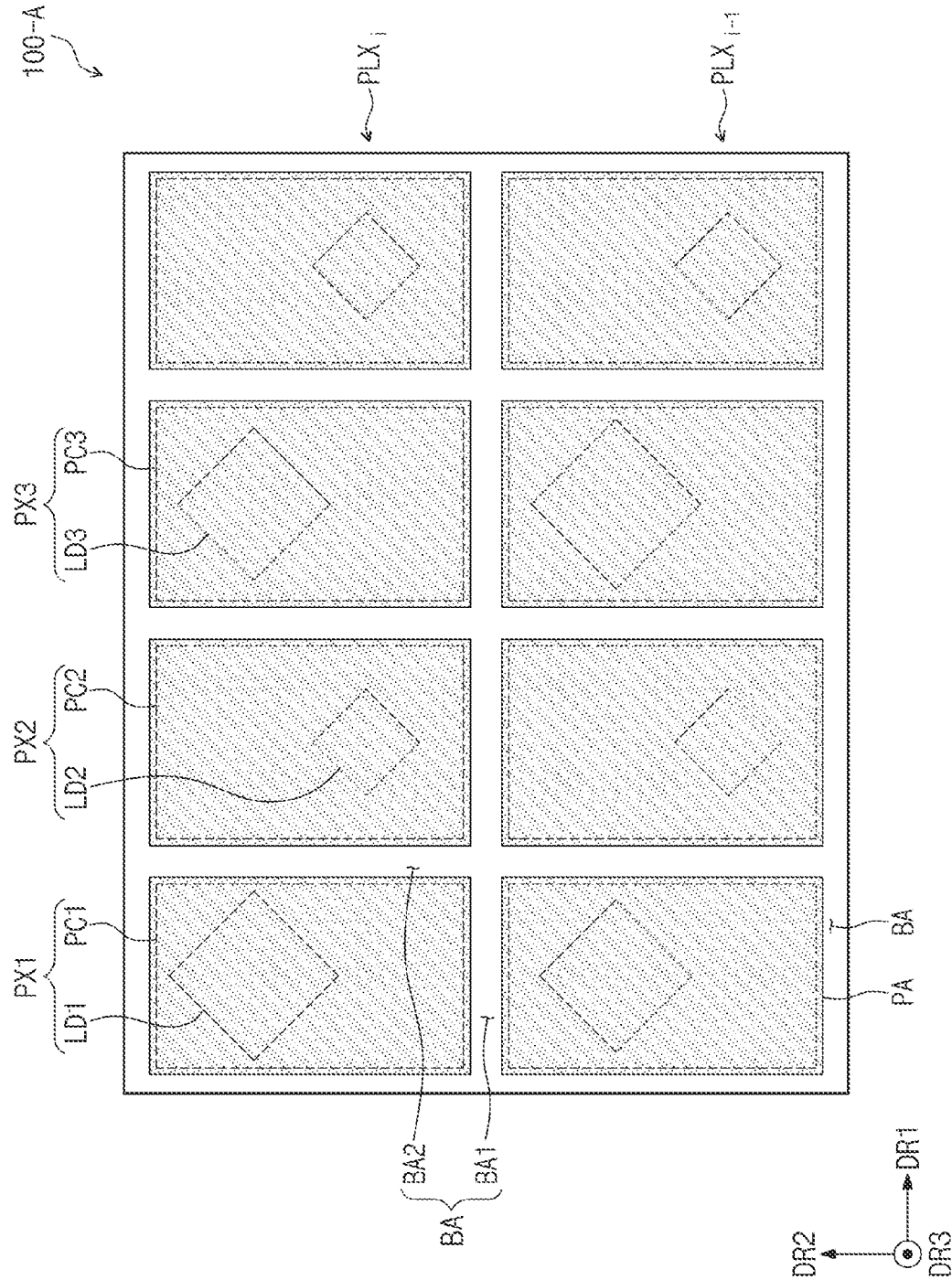
FIG. 10A and FIG. 10B are enlarged plan views of a display panel according to an embodiment of the inventive concept.
Figure 10B:
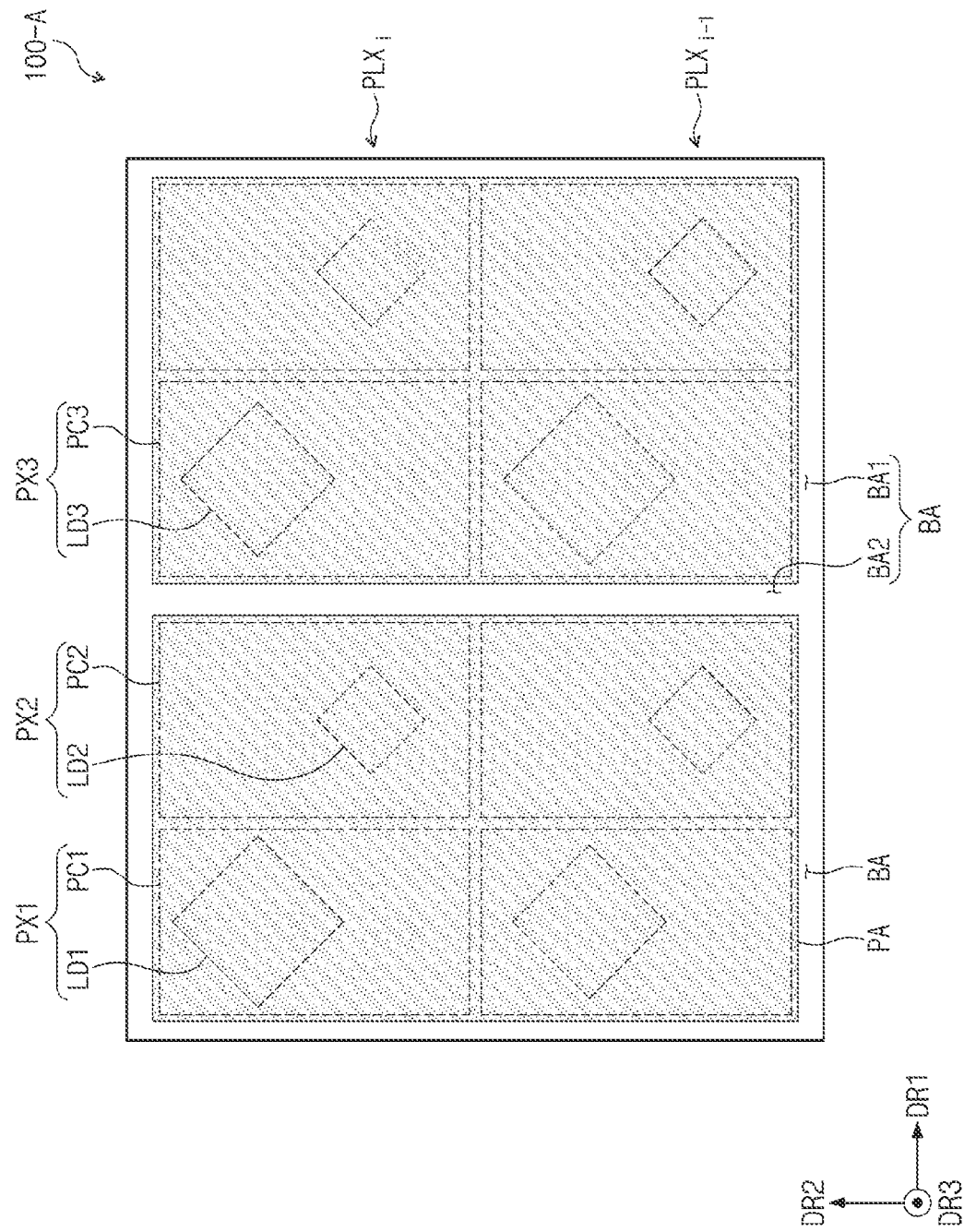

FIG. 10A and FIG. 10B are enlarged plan views of a display panel 100 according to an embodiment of the inventive concept.

As illustrated in FIG. 10A, any one among a first color pixel PX1, a second color pixel PX2, and a third color pixel PX3 may be disposed on each of the pixel regions PA, and each of the pixel regions PA may be surrounded by a boundary region BA.

As illustrated in FIG. 10B, one first color pixel PX1, one third color pixel PX3, and two second color pixels PX2 may be disposed on one pixel region PA.

Each of the pixel regions PA may be surrounded by a boundary region BA.

According to the abovementioned description, a boundary region may divide a display region into a plurality of pixel regions. The stacked structure of inorganic layers is divided into island-shaped stacked structures. The island-shaped stacked structures are disposed on every pixel regions. The stacked structure of inorganic layers isolated from each other may improve the impact resistance of a display panel compared to a stacked structure of inorganic layers commonly formed in a display region.

An organic material is filled in an opening of the inorganic layers formed in the boundary region. The organic material forms an organic pattern. A first signal line is disposed on the same layer as a layer on which the shielding electrode is disposed. The first signal line is disposed below the organic pattern. The density of signal lines disposed on the organic pattern is reduced.

A first signal line and a transistor may be electrically connected through a contact hole passing through the organic pattern. The contact hole is disposed on the boundary region, thereby improving the degree of freedom on design of a pixel region.

Although the present disclosure has been described with reference to the embodiments, it will be understood that various changes and modifications of the present disclosure may be made by one ordinary skilled in the art or one having ordinary knowledge in the art without departing from the spirit and technical field of the present disclosure as hereinafter claimed. Therefore, the technical scope of the inventive concept should not be limited to the contents described in the detailed description of the specification, but should be determined by the claims below.

What is claimed is:

1. A display panel comprising:
   a base layer including a boundary region and a pixel region;
   a light-emitting element disposed on the base layer;
   a first shielding electrode disposed on the base layer;
   a first signal line disposed on the base layer and disposed on the same layer as a layer on which the first shielding electrode is disposed;
   a first transistor disposed on the first shielding electrode and including a first input region, a first output region, a first channel region, and a first gate;
   an upper electrode disposed on the first gate, overlapping the first gate, and defining a capacitor with the first gate;
   a second transistor including a second input region, a second output region, a second channel region, and a second gate;
   a plurality of inorganic insulating layers disposed on the base layer and having an opening corresponding to the boundary region;
   an organic layer disposed in the opening;
   a first connection electrode disposed on the uppermost inorganic insulating layer among the plurality of inorganic insulating layers, connected to the first signal line through a first contact hole passing through the organic layer, and connected to the second output region through a second contact hole passing through corresponding inorganic insulating layers among the plurality of inorganic insulating layers; and a second signal line disposed on a layer different from a layer on which the first signal line is disposed and electrically connected to the second gate.

2. The display panel of claim 1, wherein the second input region is electrically connected to the first gate.

3. The display panel of claim 2, wherein the first signal line receives a bias voltage.

4. The display panel of claim 3, wherein the second signal line receives a pulse signal, and
wherein a line resistance of the second signal line is smaller than a line resistance of the first signal line.

5. The display panel of claim 3, wherein a line resistance of the second signal line is smaller than a line resistance of the first signal line, and
wherein a line width of the first signal line is larger than a line width of the second signal line.

6. The display panel of claim 2, further comprising a second shielding electrode disposed on the first transistor,
wherein the first shielding electrode and the second shielding electrode are disposed on layers different from each other.

7. The display panel of claim 2, wherein the first channel region comprises a polysilicon semiconductor, and the second channel region comprises an oxide semiconductor.

8. The display panel of claim 1, further comprising a third transistor including a third input region, a third output region, a third channel region, and a third gate,
wherein the second signal line is electrically connected to the third gate.

9. The display panel of claim 8, wherein the third channel region and the first channel region are disposed on the same layer, and have an integral shape.

10. The display panel of claim 1, further comprising:
a third signal line disposed on the base layer and disposed on the same layer as a layer on which the first shielding electrode is disposed;
a third transistor including a third input region, a third output region, a third channel region, and a third gate, and electrically connected to an anode of the light-emitting element; and
a second connection electrode disposed on the uppermost inorganic insulating layer, connected to the second signal line through a third contact hole passing through the organic pattern, and connected to the third output region through a fourth contact hole passing through corresponding inorganic insulating layers among the plurality of inorganic insulating layers.

11. The display panel of claim 10, wherein the third channel region and the first channel region are disposed on the same layer, and
wherein the third channel region and the second channel region are disposed on different layers from each other.

12. The display panel of claim 1, further comprising:
a third transistor including a third input region, a third output region, a third channel region, and a third gate; and
a third signal line disposed on the uppermost insulating layer among the plurality of insulating layers,
wherein the third signal line is electrically connected to the third output region.

13. The display panel of claim 1, wherein a portion of the second signal line is in contact with an upper surface of the organic pattern.

14. The display panel of claim 1, wherein the boundary region comprises a first region extending in a first direction and a second region extending from the first region along a second direction crossing the first direction.

15. A display panel comprising:
a base layer including a boundary region and a pixel region;
a shielding electrode disposed on the base layer;
a first signal line disposed on the base layer and disposed on the same layer as a layer on which the shielding electrode is disposed;
a first transistor disposed on the shielding electrode and including a first input region, a first output region, a first channel region overlapping the shielding electrode, and a first gate;
an upper electrode disposed on the first gate, overlapping the first gate, and defining a capacitor with the first gate;
a second transistor including a second input region, a second output region, a second channel region, and a second gate;
a plurality of inorganic insulating layers disposed on the base layer and including an opening corresponding to the boundary region;
an organic layer disposed in the opening;
a connection electrode disposed on the uppermost inorganic insulating layer among the plurality of inorganic insulating layers and electrically connecting the first signal line passing through the organic pattern and electrically connecting the second output region; and
a second signal line at least partially disposed on the same layer as a layer on which the first gate, the second gate, or the connection electrode is disposed and electrically connected to the second gate.

16. The display panel of claim 15, wherein the second gate is disposed on a layer different from a layer on which the first gate, the upper electrode, and the connection electrode are disposed.

17. The display panel of claim 15, further comprising a third signal line disposed on a layer different from a layer on which the first signal line and the second signal line are disposed,
wherein:
the second gate is disposed on a layer different from a layer on which the first gate, the upper electrode, and the connection electrode are disposed;
the second signal line is disposed on the same layer as a layer on which the connection electrode is disposed; and
the third signal line is disposed on the same layer as a layer on which any one among the first gate, the upper electrode, and the second gate is disposed.

18. The display panel of claim 15, wherein:
the first signal line and the shielding electrode comprise a molybdenum layer;
the second signal line comprises an aluminum layer; and
the first signal line receives a bias voltage, and the second signal line receives a pulse signal.

* * * * *